(12) United States Patent
Uetake et al.

(10) Patent No.: US 7,397,171 B2
(45) Date of Patent: Jul. 8, 2008

(54) SURFACE MOUNT TYPE PIEZOELECTRIC VIBRATOR AND ITS FABRICATING METHOD, OSCILLATOR, ELECTRONIC APPARATUS AND RADIO WAVE TIMEPIECE

(75) Inventors: Hiroaki Uetake, Chiba (JP); Yuki Hoshi, Chiba (JP)

(73) Assignee: Seiko Instruments, Inc. (JP)

( * ) Notice: Subject to any disclaimer, the term of this patent is extended or adjusted under 35 U.S.C. 154(b) by 0 days.

(21) Appl. No.: 11/505,594

(22) Filed: Aug. 17, 2006

(65) Prior Publication Data

US 2007/0046150 A1 Mar. 1, 2007

(30) Foreign Application Priority Data

Aug. 30, 2005 (JP) ............................ 2005-249250

(51) Int. Cl.
*H01L 41/053* (2006.01)
(52) U.S. Cl. .................. 310/344; 310/340; 310/370
(58) Field of Classification Search ................ 310/340, 310/344, 370
See application file for complete search history.

(56) References Cited

U.S. PATENT DOCUMENTS

| | | | | |
|---|---|---|---|---|
| 5,773,914 A | * | 6/1998 | Gottier | 310/344 |
| 6,005,329 A | * | 12/1999 | Ikeda et al. | 310/340 |
| 6,031,318 A | * | 2/2000 | Sunaga et al. | 310/340 |
| 6,194,816 B1 | * | 2/2001 | Wakabayashi et al. | 310/348 |
| 6,300,707 B1 | * | 10/2001 | Takehana et al. | 310/348 |
| 2006/0176128 A1 | * | 8/2006 | Matsuyama et al. | 333/187 |
| 2007/0090727 A1 | * | 4/2007 | Uetake et al. | 310/344 |

FOREIGN PATENT DOCUMENTS

| | | | |
|---|---|---|---|
| JP | 2000-216659 | * | 8/2000 |
| JP | 2004-063387 | | 2/2004 |

* cited by examiner

*Primary Examiner*—Thomas M Dougherty
(74) *Attorney, Agent, or Firm*—Brinks Hofer Gilson & Lione

(57) ABSTRACT

To propose a structure of a small-sized airtight terminal capable of restraining a reduction in yield of steps of fabricating an airtight terminal and steps of integrating a piezoelectric vibrator and a mold structure of a surface mount type piezoelectric vibrator in correspondence with the airtight terminal, there is provided a surface mount type piezoelectric vibrator including a piezoelectric vibrating piece having a pair of exciting electrodes, a first electrode of the pair of exciting electrodes being electrically connected to the lead, and a second electrode thereof being electrically connected to a stem of an airtight terminal, a case of a bottomed cylinder type fixed to the stem to cover the piezoelectric vibrating piece to form an airtight space, a first external electrode terminal electrically conductive to the first electrode by way of the lead, a second external electrode terminal electrically conductive to the second electrode, and a mold resin molded to be formed on surfaces of the case and the airtight terminal to expose end portions of the respective first and second external electrode terminals.

22 Claims, 16 Drawing Sheets

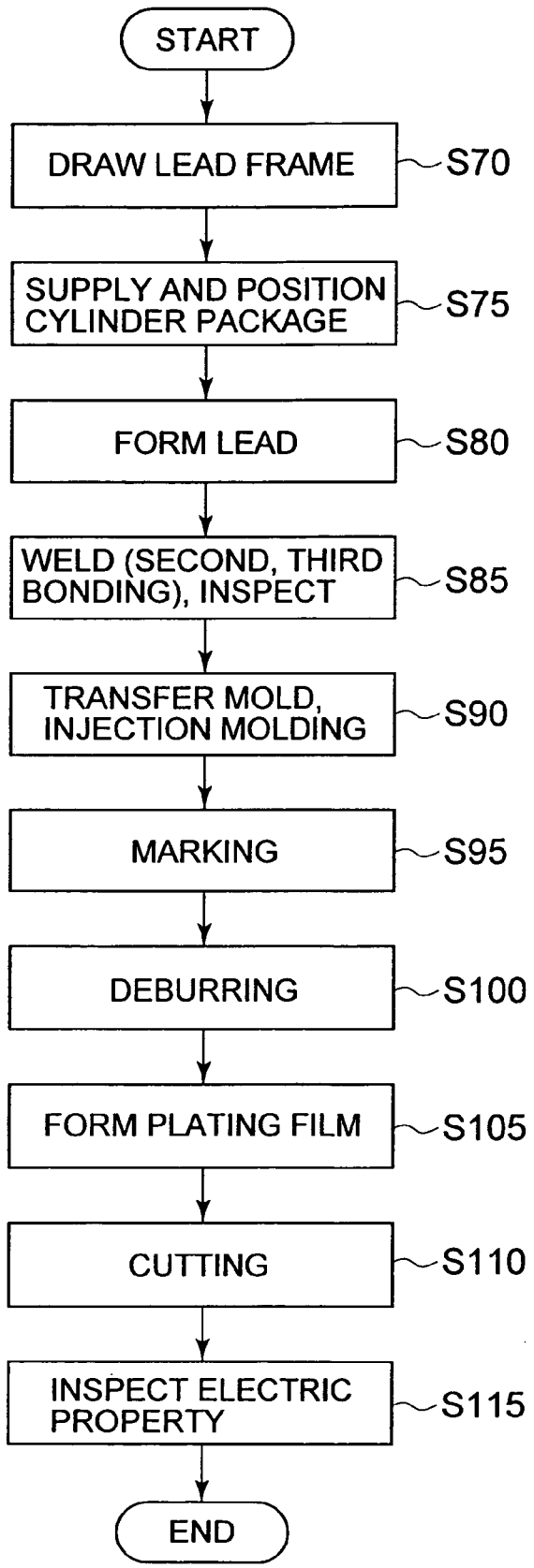

FIG. 12C         FIG. 12A         FIG. 12B
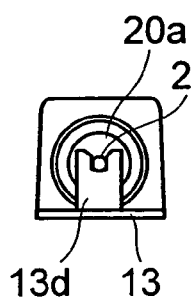 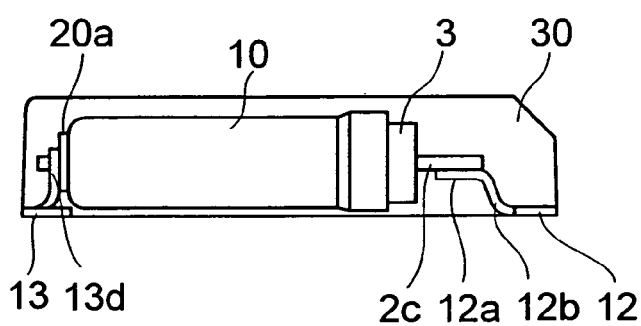 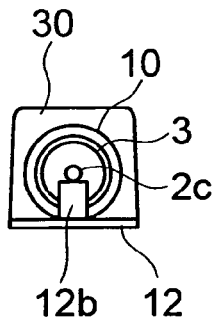
FIG. 12D
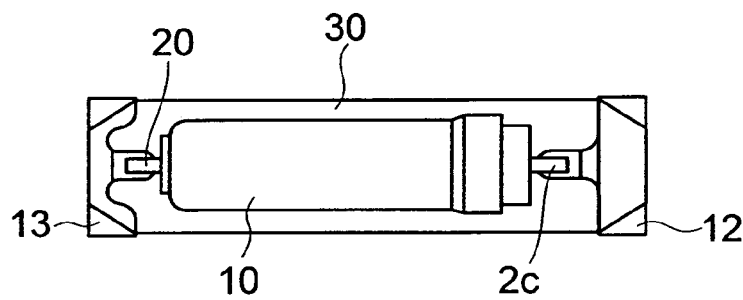
FIG. 12E                              FIG. 12G
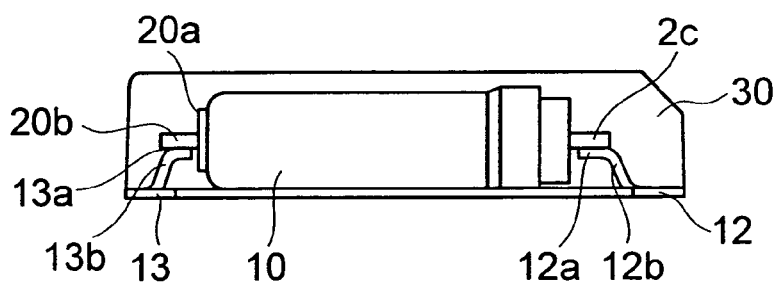  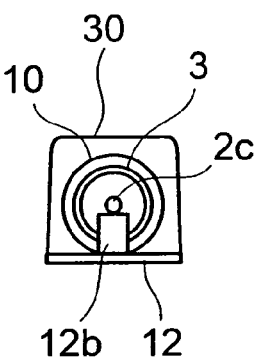
FIG. 12F
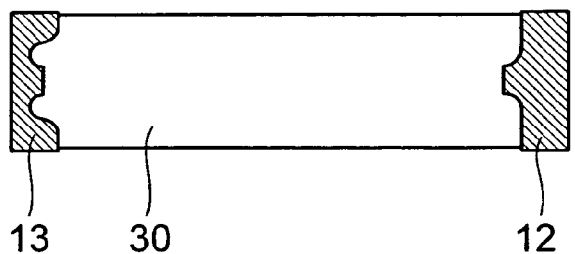

FIG. 14C  FIG. 14A  FIG. 14B
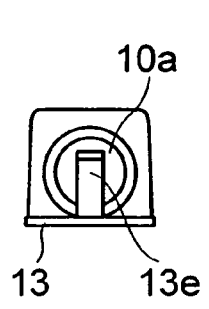 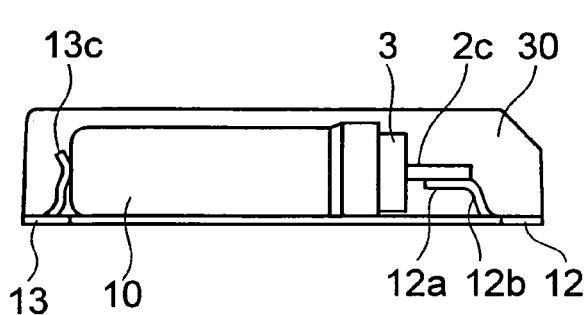 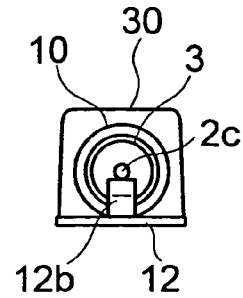
FIG. 14E  FIG. 14D
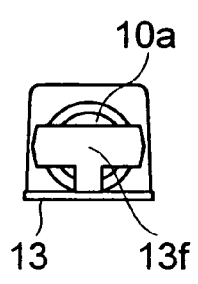 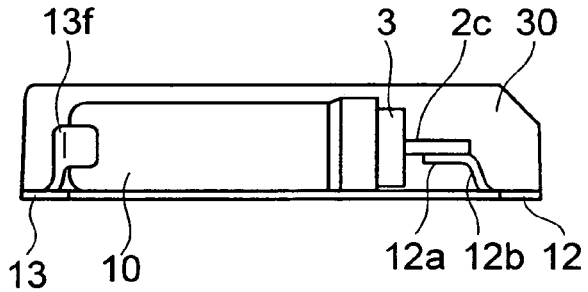
FIG. 14G  FIG. 14F
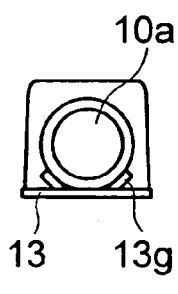 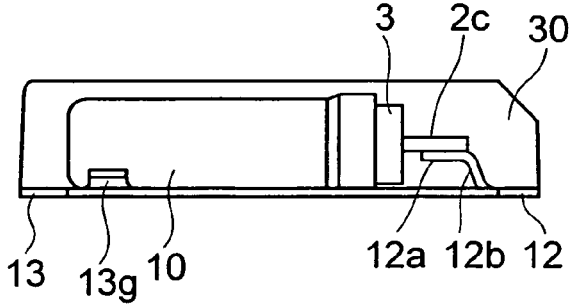

FIG. 15A
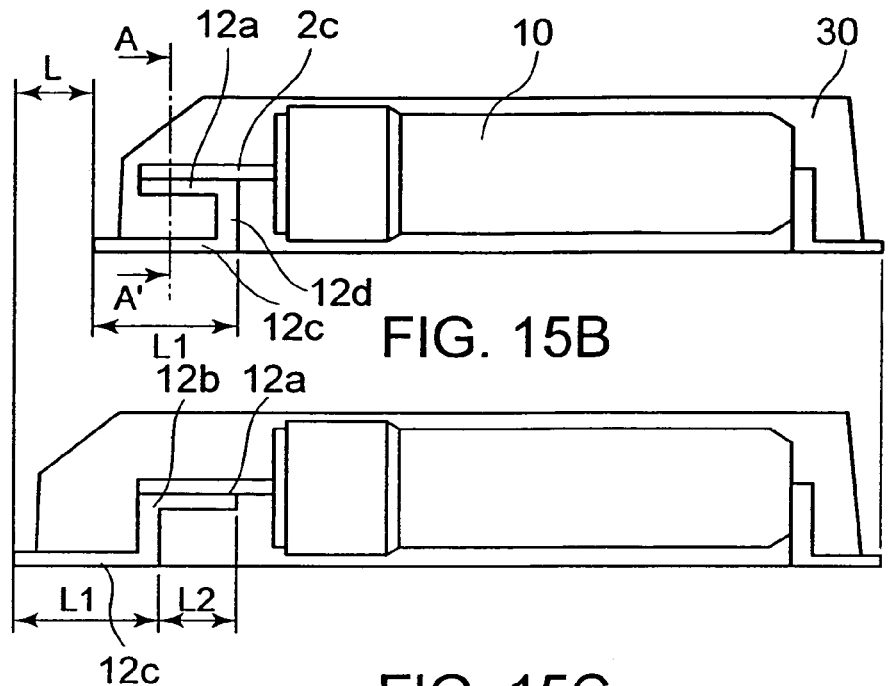
FIG. 15B
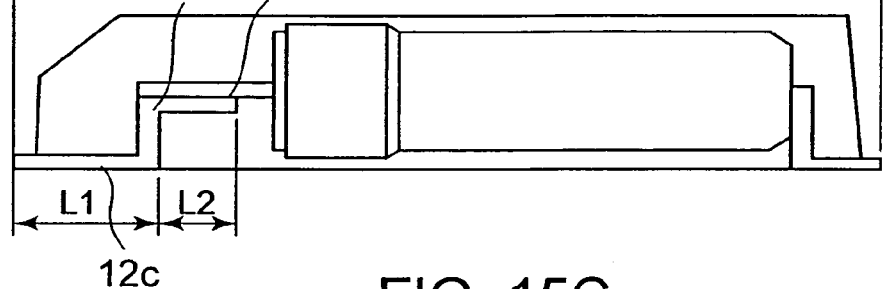
FIG. 15C
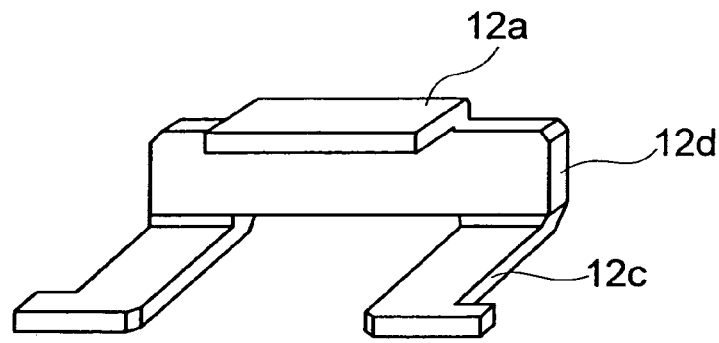
FIG. 15D
FIG. 15E
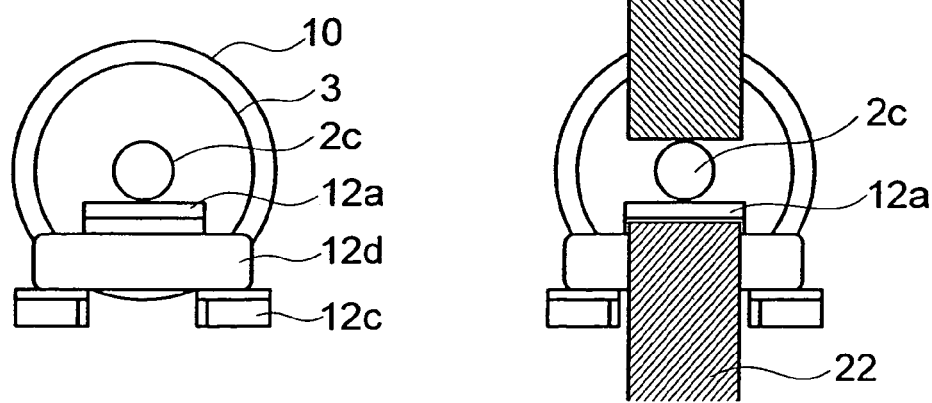

SURFACE MOUNT TYPE PIEZOELECTRIC VIBRATOR AND ITS FABRICATING METHOD, OSCILLATOR, ELECTRONIC APPARATUS AND RADIO WAVE TIMEPIECE

This application claims priority under 35 U.S.C. §119 to Japanese Patent Application No. JP2005-249250 filed Aug. 30, 2005, the entire content of which is hereby incorporated by reference.

BACKGROUND OF THE INVENTION

1. Field of the Invention

The present invention relates to a surface mount type piezoelectric vibrator having an airtight terminal and its fabricating method, an oscillator having a surface mount type piezoelectric vibrator, and an electronic apparatus and a radio wave timepiece.

2. Description of the Related Art

There is a piezoelectric vibrator as a circuit element indispensable for fabricating an industrial product of a timepiece, a portable apparatus, an electronic apparatus or the like. As a package of a piezoelectric vibrator, a ceramic type package constituted by a box type shape and a cylinder type package (hereinafter, referred to as bottomed cylinder type) having a lead have commonly been used. In the latter package, the lead is directly mounted to a board by soldering or the like, further, the package is molded by a resin to be adapted to machine mounting utilizing an automatic mounting machine, and a molded part provided with an electrode terminal by a lead frame in fabricated as a surface mount type piezoelectric vibrator.

An explanation will be given of a constitution of a piezoelectric vibrator of a bottomed cylinder type and a surface mount type piezoelectric vibrator as a resin molded product thereof in reference to the drawings as follows.

FIGS. 19A and 19B illustrate outline constitution views of a piezoelectric vibrator comprising a bottomed cylinder type of a vibrator by quartz of a related art. A piezoelectric vibrating piece 6 is fixedly attached to a lead of an airtight terminal by plating or an electrically conductive adhesive, not illustrated, and is sealed in airtight by a case 10 of a bottomed cylinder type by case capping of tight fitting. In FIGS. 19A and 19B, the case 10 is indicated by a transparent member. An airtight terminal 1 is filled with a filling member 4 for hermetic sealing at inside of an outer ring made of a metal referred to as a stem 3, the filling member 4 is arranged with two pieces of leads 2 having the same diameter comprising slender rods made of a metal symmetrically relative to a center line of the stem and the leads 2 are penetrated to fix to the filling member 4 in parallel. A plating film 5 is provided to surfaces of the lead 2 and the stem 3 (the plating film on the lead is not illustrated). In connecting an inner lead 2a and the piezoelectric vibrating piece 6, the plating film 5 at the surface of the inner lead 2a is locally melted and is fixedly attached to a mount pad 9 constituting a connecting region formed at a base portion 7 of the piezoelectric vibrating piece 6. Bonding in airtight between the stem 3 and the case 10 is realized by cold pressure welding by way of the plating film 5 comprising a soft metal at the outer ring of the stem 3. Further, in the lead 2, a side of being bonded to the piezoelectric vibrating piece 6 is referred to as inner lead and is designated by notation 2a, and the lead on a side of being mounted to a board or the like is referred to as outer lead and is designated by notation 2b by constituting a boundary by the filling member 4.

FIGS. 20A to 20G show constitutions of a surface mount type piezoelectric vibrator of a resin molded product of a related art. A molded part is constituted by a structure of molding a piezoelectric vibrator 40 of the bottomed cylinder type by using a resin 30 of an epoxy species resin which is a thermosetting resin or liquid crystal polymer having thermoplasticity or the like. Further, it is devised that an outer shape dimension of the molded product is not larger than the package. That is, as shown by FIG. 20D, a connecting portion 34a of a front end of an external electrode terminal 34 is mechanically and electrically connected to the outer lead 2b of the airtight terminal by a method of spot welding or the like at inside of a space molded by the resin to constitute a structure of being exposed to a bottom face from the connecting portion 34a by way of a bent portion 33 in a crank-like shape. Further, other end portion is arranged with an external electrode terminal 35 which includes an erected portion 35a at inside of the resin 30 and is not connected to the piezoelectric vibrating piece to constitute a structure of capable of being mounted solidly in mounting a board. By devising in this way, there is constituted a structure in which a width dimension of the molded product can sufficiently be made to be smaller than the ceramic package and therefore, the molded product is frequently used in a portable apparatus requesting high density mounting.

Further, as shown by FIGS. 20F, 20G, the above-described molded part is fabricated by fabricating steps comprising steps of mounting a finished package of the bottomed cylinder type to a lead frame 31, bonding the pair of leads of the piezoelectric vibrator to external terminal electrodes which are previously formed on the lead frame, thereafter, molding the part by a resin and thereafter, cutting the part to pieces.

In a progress of small-sized and light-weighted formation of an electronic apparatus represented by portable apparatus in recent years, also a dimension of an electronic part becomes further shorter and smaller. A dimension D shown in FIG. 19A becomes 1.5 mm from 2 mm, further, a piezoelectric vibrator of 1.2 mm is frequently used in a portable telephone. In the future, when a mounting density is further promoted, or in a piezoelectric vibrator mounted to a thin type card, and an airtight terminal having the dimension D equal to or smaller than 1 mm is needed.

However, there is a limit in small-sized formation in the current structure of the airtight terminal of arranging a pair of leads having the equal diameter symmetrically relative to a center line of the stem. Even in the small-sized formation, the lead per se needs a constant or more of rigidity against an external force of bending or the like. When the rigidity of the lead is deficient, a deterioration in a positional accuracy relative to the piezoelectric vibrating piece, or a deficiency in a strength of bonding is liable to be brought about and yield of an integrating step is reduced. On the other hand, when a lead having a bold wire diameter is used in order to increase rigidity, a distance between the leads is narrowed, at a barrel plating step in steps of fabricating the airtight terminal, a failure of connecting the leads by plating or the like is frequently brought about to considerably reduce fabrication yield.

Furthermore, in a small-sized piezoelectric vibrator in the future, a package of a bottomed cylinder shape exposing a pair of leads which are simply folded to bend is extremely inconvenient in mounting by a customer. A proposal of a mold structure of a small-sized piezoelectric vibrator suitable for machine mounting has strongly been desired.

Patent Reference 1: JP-A-2004-63387

SUMMARY OF THE INVENTION

In view of the above-described problem, it is an object of the invention to propose a structure of a small-sized airtight terminal capable of restraining a reduction in yield of steps of fabricating the airtight terminal and steps of integrating a piezoelectric vibrator and show a mold structure of a surface mount type piezoelectric vibrator in correspondence with the airtight terminal.

A structure of the airtight terminal in the related art is basically looked at again to constitute a structure capable of dealing with small-sized formation. Further, a resin mold structure of a surface mount type piezoelectric vibrator in correspondence with the small-sized airtight terminal is proposed.

A basic way of thinking of a small-sized airtight terminal and a resin mold structure thereof is as follows.

(1) There is provided a surface mount type piezoelectric vibrator comprising an airtight terminal including a stem in a ring-like shape comprising an electrically conductive material, a lead arranged to penetrate inside of the stem and electrically insulted from the stem, and a filling member for sealing the lead at inside of the stem in airtight, a piezoelectric vibrating piece having a pair of exciting electrodes, a first electrode of the pair of exciting electrodes being electrically connected to the lead, and a second electrode thereof is being electrically connected to the stem, a case of a bottomed cylinder type fixed to the stem to cover the piezoelectric vibrating piece to form an airtight space, a first external electrode terminal electrically conductive to the first electrode by way of the lead, a second external electrode terminal electrically conductive to the second electrode, and a mold resin molded to be formed on surfaces of the case and the airtight terminal to expose end portions of the respective first and second external electrode terminals.

(2) There is provided the surface mount type piezoelectric vibrator, wherein the first external electrode terminal is constituted by a sectional shape in a channel-like shape with regard to a longitudinal direction of the surface mount type piezoelectric vibrator.

(3) There is provided the surface mount type piezoelectric vibrator, wherein the lead is made to constitute a first lead, further comprising a second lead arranged at inside of the stem for making the second electrode and the second external electrode terminal electrically conductive to each other, and a third external electrode terminal electrically insulated from the respective first and second electrodes and fixedly attached by the mold resin, wherein end portions of the respective first, second, and third external electrode terminals are exposed.

(4) There is provided the surface mount type piezoelectric vibrator, wherein an end portion on a side of an outer lead of the second lead is disposed at a position substantially the same as a position of an end portion on the side of the outer lead of the stem or slightly protruded therefrom, wherein the case comprises an electrically conductive material, and wherein the second external electrode terminal is bonded to the stem or the case.

(5) There is provided the surface mount type piezoelectric vibrator, wherein the lead is made to constitute the first lead, further comprising a second lead arranged at inside of the stem for making the second electrode and the second external electrode terminal electrically conductive to each other, wherein an end portion on a side of an outer lead of the second lead is disposed at a position substantially the same as a position of an end portion on the side of the outer lead of the stem or slightly protruded therefrom, wherein the case comprises an electrically conductive material, and wherein the second external electrode terminal is bonded to the case.

(6) There is provided the surface mount type piezoelectric vibrator, further comprising a connecting member comprising an electrically conductive material at a bottom face of the case, wherein the second external electrode terminal is bonded to the connecting member.

(7) There is provided the surface mount type piezoelectric vibrator, wherein the stem includes a first and a second projected portion constituted by extending a portion of an outer periphery thereof in directions opposed to each other in an axial direction, wherein the second electrode and the second external electrode terminal are made to be electrically conductive by way of the first and the second projected portions, further comprising a third external electrode terminal electrically insulated from the respective first and second electrodes and fixedly attached by the mold resin, wherein end portions of the respective first, second and third external electrode terminals are exposed.

(8) There is provided the surface mount type piezoelectric vibrator, wherein the stem includes a projected portion constituted by extending a portion of an outer periphery thereof in an axial direction, wherein the case comprises an electrically conductive material, wherein the second external electrode terminal is bonded to the stem or the case, wherein the second electrode and the second external electrode terminal are made to be electrically conductive by way of the projected portion, further comprising a third external electrode terminal electrically insulated from the respective first and second electrodes and fixedly attached by the mold resin, wherein end portions of the respective first, second and third external electrode terminals are exposed.

(9) There is provided the surface mount type piezoelectric vibrator, wherein the stem includes a projected portion constituted by extending a portion of an outer periphery thereof in an axial direction, wherein the case comprises an electrically conductive material, wherein the second external electrode terminal is bonded to the case, wherein the second electrode and the second external electrode terminal are made to be electrically conductive by way of the projected portion, and wherein end portions of the respective first, second external electrode terminals are exposed.

(10) There is provided the surface mount type piezoelectric vibrator, further comprising a connecting member comprising an electrically conducive material at a bottom face of the case, and wherein the second external electrode terminal is bonded to the connecting member.

Further, a method of fabricating a surface mount type piezoelectric vibrator having the airtight terminal and the mold structure mentioned above is as follows.

(11) There is provided a method of fabricating a surface mount type piezoelectric vibrator, the method comprising a first bonding step of bonding the first electrode of the piezoelectric electric vibrating piece to the lead of the airtight terminal, and bonding the second electrode to a portion of the airtight terminal electrically conductive to the stem, respectively, a sealing step of inserting to fix the stem of the airtight terminal to the case to cover a surrounding of the piezoelectric vibrating piece bonded to the airtight terminal to thereby constitute the piezoelectric vibrator, an external electrode terminal forming step of forming the first external electrode terminal and the second electrode terminal at a lead frame comprising an electrically conductive material, a mounting step of arranging the piezoelectric vibrator at a predetermined position on the lead frame, a second bonding step of bonding a side of an outer lead of the lead and the first external electrode terminal, a third bonding step of bonding a surface of the piezoelectric vibrator electrically conductive to the stem and the second electrode terminal, and a molding step of molding the resin on surfaces of the case and the airtight terminal to expose end portions of the respective first and the second external electrode terminals.

(12) There is provided the method of fabricating a surface mount type piezoelectric vibrator, wherein the lead of the airtight terminal bonded to the first electrode of the piezoelectric vibrating piece in the first bonding step is made to constitute a first lead, and the portion bonded to the second electrode electrically conductive to the stem is made to constitute a second lead, wherein in the external electrode terminal forming step, the lead frame is further formed with a third external electrode terminal, and wherein in the molding step, the resin is molded to expose also an end portion of the third external electrode terminal in a state of making the third external electrode terminal and a surface of the piezoelectric vibrator electrically insulated from each other.

(13) There is provided the method of fabricating a surface mount type piezoelectric vibrator, wherein as the airtight terminal, an airtight terminal in which an end portion on a side of an outer lead of the second lead is disposed at a position substantially the same as a position of an end portion on the side of the outer lead of the stem or slightly projected from is used.

(14) There is provided the method of fabricating a surface mount type piezoelectric vibrator, wherein the lead of the airtight terminal bonded to the first electrode of the piezoelectric vibrating piece in the first bonding step is made to constitute the first lead, and a portion bonded to the second electrode electrically conductive to the stem is made to constitute a second lead, wherein the airtight terminal in which an end portion on a side of an outer lead of the second lead is disposed at a position substantially the same as a portion of an end portion on a side of an outer lead of the stem or slightly projected therefrom is used, and wherein in the third bonding step, a surface of the piezoelectric vibrator is bonded to the second external electrode terminal as a surface of the case.

(15) There is provided the method of fabricating a surface mount type piezoelectric vibrator, further comprising a connecting member bonding step of bonding a connecting member comprising an electrically conductive material to a bottom surface of the case before the sealing step, wherein in the third bonding step, a surface of the piezoelectric vibrator is bonded to the second external electrode terminal as a surface of the bonding member.

(16) There is provided the method of fabricating a surface mount type piezoelectric vibrator, wherein an airtight terminal including a first and a second projected portion constituted by extending a portion of an outer periphery of the stem of the airtight terminal in directions opposed to each other in an axial direction is used, wherein in the first bonding step, the first electrode of the piezoelectric vibrating piece is bonded to the lead, and the second electrode is bonded to the first protruded portion, respectively, wherein in the third bonding step, the second protruded portion and the second external electrode terminal are bonded, wherein in the external electrode terminal forming step, the lead frame is further formed with a third external electrode terminal, and wherein the resin is molded to expose also an end portion of the third external electrode terminal in a state of electrically insulating the third external electrode terminal and a surface of the piezoelectric vibrator from each other.

(17) There is provided the method of fabricating a surface mount type piezoelectric vibrator, wherein the airtight terminal including a protruded portion constituted by extending a portion of an outer periphery of the stem of the airtight terminal in an axial direction is used, wherein in the first bonding step, the first electrode of the piezoelectric vibrating piece is bonded to the lead, and the second electrode is bonded to the protruded portion respectively, wherein in the external electrode terminal forming step, the lead frame is further formed with a third external electrode terminal, and wherein in the molding step, the resin is molded to expose also an end portion of the third external electrode terminal in a state of electrically insulating the third external electrode terminal and the surface of the piezoelectric vibrator from each other.

(18) There is provided the method of fabricating a surface mount type piezoelectric vibrator, wherein the airtight terminal including a projected portion constituted by extending a portion of an outer periphery of the stem of the airtight terminal in an axial direction is used, and wherein in the first bonding step, the first electrode of the piezoelectric vibrating piece is bonded to the lead and the second electrode is bonded to the protruded portion, respectively.

(19) There is provided the method of fabricating a surface mount type piezoelectric vibrator, further comprising a connecting member bonding step of bonding a connecting member comprising an electrically conductive material to a bottom surface of the case before the sealing step, wherein in the third bonding step, a surface of the piezoelectric vibrator is bonded to the second external electrode terminal as a surface of the connecting member.

Further, in order to resolve the above-described problem, according to the invention, a structure of a piezoelectric vibrator before molding a case and a resin and its fabricating method are proposed other than an airtight terminal and a resin mold structure as described below.

(20) There is provided a case which is a case of a bottomed cylinder type forming an airtight space by being paired with an airtight terminal, wherein a connecting member comprising an electrically conducive material is bonded to a bottom surface of the case with an object of being connected to an external electrode terminal previously formed at a lead frame.

(21) There is provided a piezoelectric vibrator which is a piezoelectric vibrator in which a piezoelectric vibrating piece is bonded to an airtight terminal, and a stem of the airtight terminal is inserted into a case of a bottomed cylinder type to cover the piezoelectric vibrating piece to form an airtight space, wherein a connecting member comprising an electrically conductive material is bonded to a bottom surface of the case.

(22) There is provided a method of fabricating a piezoelectric vibrator which is a method of fabricating a piezoelectric vibrator in which a piezoelectric vibrating piece is bonded to an airtight terminal, and a stem of the airtight terminal is inserted into a case of a bottomed cylinder type to cover the piezoelectric vibrating piece to form an airtight space, wherein after bonding a connecting member comprising an electrically conductive material to a bottom surface of the case, the stem is inserted into the case to form the airtight space.

(23) There is provided a method of fabricating a piezoelectric vibrator which is a method of fabricating a piezoelectric vibrator in which a piezoelectric vibrating piece is bonded to an airtight terminal, and a stem of the airtight terminal is inserted into a case of a bottomed cylinder type to cover the piezoelectric vibrating piece to form an airtight space, wherein after forming the airtight space by inserting the stem into the case, a connecting member comprising an electrically conductive material is bonded to a bottom surface of the case.

Further, according to the invention, it is proposed to use the surface mounting type piezoelectric vibrator or the piezoelectric vibrator before molding the resin for use shown below.

(24) The surface mount type piezoelectric vibrator or the piezoelectric vibrator is made to constitute an oscillator used by being connected to an integrated circuit as an oscillation piece.

(25) The surface mount type piezoelectric vibrator or the piezoelectric vibrator is made to constitute an electronic apparatus used by being connected to a time counting portion.

(26) The surface mount type piezoelectric vibrator or the piezoelectric vibrator is made to constitute a radio wave timepiece used by being connected to a filter portion.

By making one piece of the lead (second lead) in two pieces of the pair of leads constituting the airtight terminal constitute the airtight terminal electrically conductive to the inner face of the stem, the interval between the pair of leads can maximally be enlarged, the lead having a wire diameter bolder than that of the related art can be adopted, and the rigidity of the lead can be increased. As a result, the problem of deteriorating the integrating yield by deteriorating the positional accuracy of the piezoelectric vibrating piece by bending the lead in the integrating step can be resolved. Further, a failure of connecting the leads by plating or the like in the barrel plating step of the airtight terminal fabricating step can be restrained. Further, even when the lead having the wire diameter the same as that of the related art is used, the stem outer diameter of the airtight terminal can be made to be smaller than that of the related art, and the further small-sized airtight terminal can be provided.

Further, in the airtight terminal, by making the diameter of the lead (first lead) electrically insulated from the stem proximate to the center line of the stem bold and making the sectional area larger the sectional area of the lead (second lead) connected to the stem, the piezoelectric vibrating piece can mechanically solidly fixed by the lead having the large sectional area and the high rigidity. The second lead connected to the stem can be made to constitute mainly an object of only electric connection. In this way, the lead having the sectional area larger than that of the related art and the rigidity higher than that of the related art can be used and therefore, the airtight terminal which does not reduce integrating yield in bonding can be provided even when downsized.

On the other hand, the structure of arranging the projected portion extended in the axial direction from the portion of the stem outer periphery at one side or both sides of the ring-like stem and having the function of the lead at the projected portion is constituted and therefore, the lead fixed by penetrating the filling member can be constituted by a single piece thereof. Thereby, the wire diameter of the lead fixed by penetrating the filling member can be made to be bold and the rigidity of the lead can be increased, and bending or twisting of the lead can further be restrained. By using the above-described airtight terminal, the piezoelectric vibrator further downsized than that of the related art can be fabricated with excellent yield.

Further, the following effect is achieved by the mold structure coinciding with the airtight terminal having the above-described characteristic.

By making the sectional shape with regard to the longitudinal direction of the resin molded product of at least one of the plurality of external electrode terminals of the resin molded product (surface mounting type piezoelectric vibrator) molded by the resin by the channel-like shape, the dimension in the longitudinal direction of the resin molded product can be shortened, and further small-sized formation can be achieved.

By adopting the mold resin structure of arranging the pair of outer electrode terminals connected to the exciting electrodes of the piezoelectric vibrating pieces in parallel proximate to each other at an immediate vicinity of the lead of the piezoelectric vibrator, a difference of an equivalent constant of the oscillating piece before being molded by the resin owing to a floating capacity or the like between the electrodes generated by being formed by the resin can be minimized.

Further, by directly bonding the stem and the external electrode terminal by extending the external electrode terminal on the side of the lead frame to the stem, the side of the outer lead of the second lead is dispensed with and fabrication thereof is facilitated by simplifying the structure of the airtight terminal.

Further, by previously bonding the connecting member to the outer side of the bottom face of the case, a bonding condition can be investigated only by properties of two members of the case and the connecting member. Therefore, since an optimum bonding condition can be selected from a wide bonding condition, reliable bonding can be carried out.

On the other hand, by attaching the connecting member to the bottom face of the case after capping the case to the airtight terminal, when the case is capped, the connecting member is not attached thereto and therefore, a total of the bottom face of the case can be pressed and a capping condition can be alleviated. Particularly, in the future, there is adopted plating of, for example, plating of a tin copper alloy (Sn—Cu), plating of a tin copper silver alloy (Sn—Cu—Ag) or the like eliminating lead from plating of a tin lead alloy (Sn—Pb) of the related art and therefore, the hardness of plating is liable to be increased. Therefore, a higher capping force is needed. Therefore, according to a system of capable of pressing a total of the bottom face of the case, a concern of bringing about an abnormal deformation by applying a pressing force locally to a corner portion of the bottom face of the case is reduced and smooth capping can be carried out.

Further, when small-sized formation of the piezoelectric vibrator is further progressed, the diameter of the case becomes smaller than the dimension of 1 mm and is reduced from 0.8 mm to about 0.5 mm. Therefore, the heat capacity of the piezoelectric vibrator including the case and the airtight terminal is sufficiently small, and by pertinently selecting the working means, the case per se can directly be connected to the external electrode terminal on the lead frame. In that case, the connecting member is dispensed with and the mold structure can further be simplified.

Further, there is constituted the oscillator using the surface mount type piezoelectric vibrator or the piezoelectric vibrator by being connected to an integrated circuit as the oscillating piece and therefore, the oscillation piece requiring a maximum volume is downsized, and the oscillator can further be downsized as a whole.

Further, there is constituted the electronic apparatus using the surface mount type piezoelectric vibrator or the piezoelectric vibrator by being connected to the time counting portion and therefore, the volume of the time counting portion is reduced and the electronic apparatus which can be downsized further can be constituted.

Further, there is constituted the radio wave timepiece using the surface mount type piezoelectric vibrator or the piezoelectric vibrator by being connected to the filter portion and therefore, the volume of the filter portion is downsized and the radio wave timepiece can further be downsized as a whole.

BRIEF DESCRIPTION OF THE DRAWINGS

FIG. 4 is a fabrication flowchart of a resin molding step for fabricating the piezoelectric vibrator according to the first embodiment, FIGS. 12A to 12G illustrate outline constitution views of a molded part showing the fourth embodiment, FIGS. 14A to 14G illustrate outline constitution views of a molded part of the fifth embodiment, FIGS. 15A to 15E illustrate schematic views for explaining a sixth embodiment.

DETAILED DESCRIPTION OF THE PREFERRED EMBODIMENTS

Embodiment 1

As a first embodiment of the invention, there is shown a mold structure of a bottomed cylinder type piezoelectric vibrator which includes a first and a second lead and in which the first lead is electrically insulated from a stem, and the second lead is sealed in airtight by using an airtight terminal electrically conductive to an inner face of the stem.

Figure 1A:
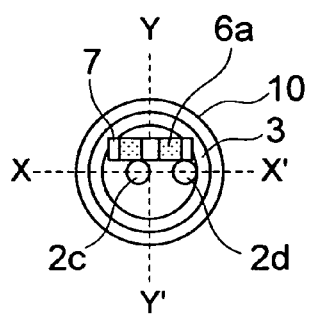
FIGS. 1A to 1F illustrate outline constitution views of a piezoelectric vibrator showing a first embodiment.
Figure 1C:
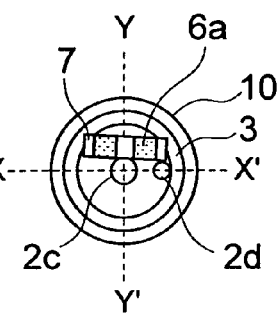
Figure 1E:
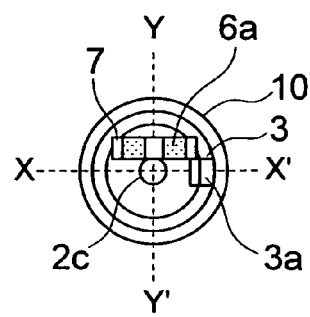
Figure 1B:
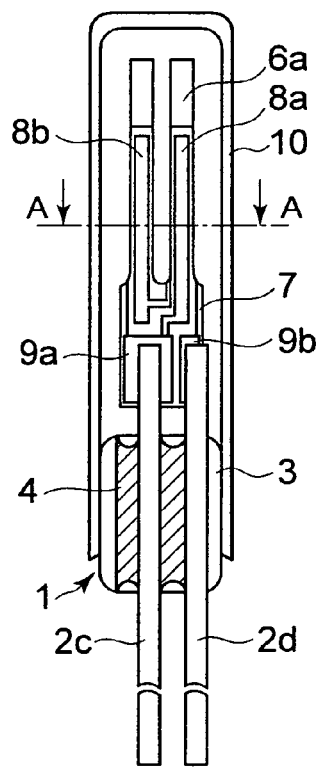
Figure 1D:
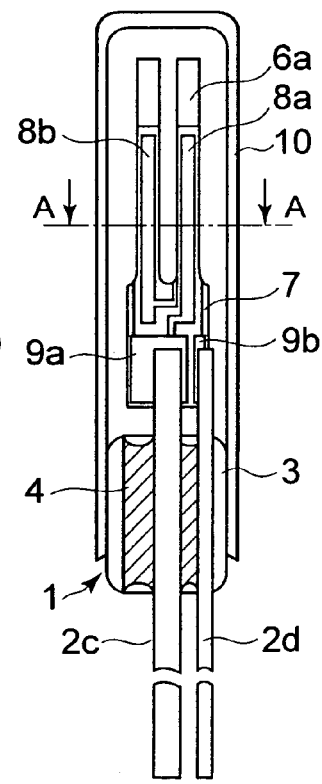

FIGS. 1A, 1B, 1C, 1D show outline constitution views of a piezoelectric vibrator of a bottomed cylinder type which includes a first and a second lead and in which the second lead is sealed by using an airtight terminal having a constitution of mechanically connecting and electrically conductive to an inner face of a stem. Here, FIG. 1A and FIG. 1C show views respectively viewing AA sections of FIG. 1B and FIG. 1D from arrow mark directions. FIG. 1B and FIG. 1D differ from each other in selecting a wire diameter of a lead. FIG. 1B shows a combination of a pair of leads substantially having the same diameter, in FIG. 1D, the first lead is selected to be bold to increase a rigidity, and the second lead is set with an object of achieving electric conduction.

Figure 1F:
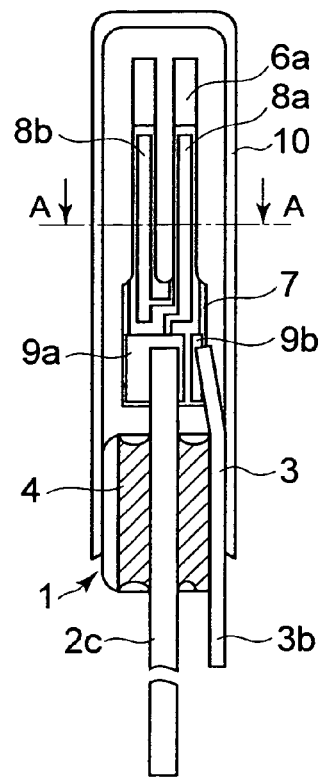

As shown by FIGS. 1B, 1D, 1F, a surface of a piezoelectric vibrating piece 6 having a pair of tuning fork arms 6a is formed with exciting electrodes 8a, 8b respectively comprising thin films of chromium or gold for bending to vibrate the tuning fork arms 6a. In the exciting electrodes, the first electrode 8a is connected to a large mount pad 9a on a left side of a base portion 7 of the piezoelectric vibrating piece 6. In the exciting electrodes, the second electrode 8b is connected to a small mount pad 9b on a right side of the base portion 7 while ensuring electric insulation from the first electrode 8a.

A pair of inner leads 2ca and 2da are bonded to the pair of mount pads 9a and 9b formed at an end portion of the base portion 7 on the piezoelectric vibrating piece 6. The bonding is realized by melting a plating film 5, not illustrated, covered on a surface of the inner lead by energy from outside. As a material of the plating film 5, tin (Sn), tin lead alloy (Sn—Pb), tin copper alloy (Sn—Cu), tin bismuth alloy (Sn—Bi) or the like is used. Or, other than bonding by melting the plating film, an electrically conductive adhesive can be used. In this case, silver (Ag) is preferable as a topmost surface layer of plating. Furthermore, by pertinently selecting the material of the plating film 5, a technology of flip chip bonding can be applied.

By constituting the airtight terminal as described above, an interval of 2 pieces of the leads in parallel with each other can be arranged to be wider than the lead interval of the related art. As a result, a reduction in yield in steps of fabricating the airtight terminal by connecting of plating between the leads which is liable to be brought about in a barrel plating step of steps of fabricating the airtight terminal can be restrained. Further, the wire diameter bolder than that of the related art can be adopted by looking at the wire diameter of the lead again and therefore, the rigidity of the lead is increased. Thereby, bending of the lead or entwining of the leads can be restrained and handling thereof in mass production steps is improved. Further, since the rigidity of the lead is increased, positions of the lead and the piezoelectric vibrating piece are finely determined and positional accuracy of mounting is promoted.

Further, as a modified example of the first embodiment, FIGS. 1E, 1F show an example of constituting a piezoelectric vibrator by using an airtight terminal provided with a protruded portion achieving a function of the second lead. FIG. 1E is a view viewing an AA section of FIG. 1F from an arrow mark direction.

An airtight terminal 1 comprises a stem 3 in a ring-like shape, a first lead 2c comprising an electrically conductive material arranged to penetrate inside of the stem 3, and the filling member 4 for fixing the first lead 2c at inside of the stem 3, and a portion of an outer periphery of the stem 3 in the ring-like shape includes an arm projected from the portion of the outer periphery of the stem 3 in respective directions opposed to each other in an axial direction, that is, on both sides of the stem 3. Hereinafter, the projected arm is referred to as a projected portion. The projected portion achieves a function of the second lead, here, a projected portion projected to the side of the inner lead is referred to as a first projected portion and designated by notation 3a, and a projected portion projected to the side of the outer lead is referred to as a second projected portion and is designated by notation 3b.

The first projected portion 3a is bent relative to a center direction of the stem by a pertinent angle and is connected to the mount pad of the piezoelectric vibrating piece 6. The projected portion 3b formed on the side of the outer lead is arranged in parallel with the first lead.

As explained above, the first pole 8a of the piezoelectric vibrating piece 6 is electrically conductive to the first lead 2c of the airtight terminal 1 by way of the mount pad 9a. Further, the second electrode 8b is electrically conductive to the second lead 2d of the airtight terminal 1 or the projected portion of the outer periphery of the stem 3 by way of the mount pad 9b and is electrically conductive also to the case 10 of the bottomed cylinder type.

Figure 2A:
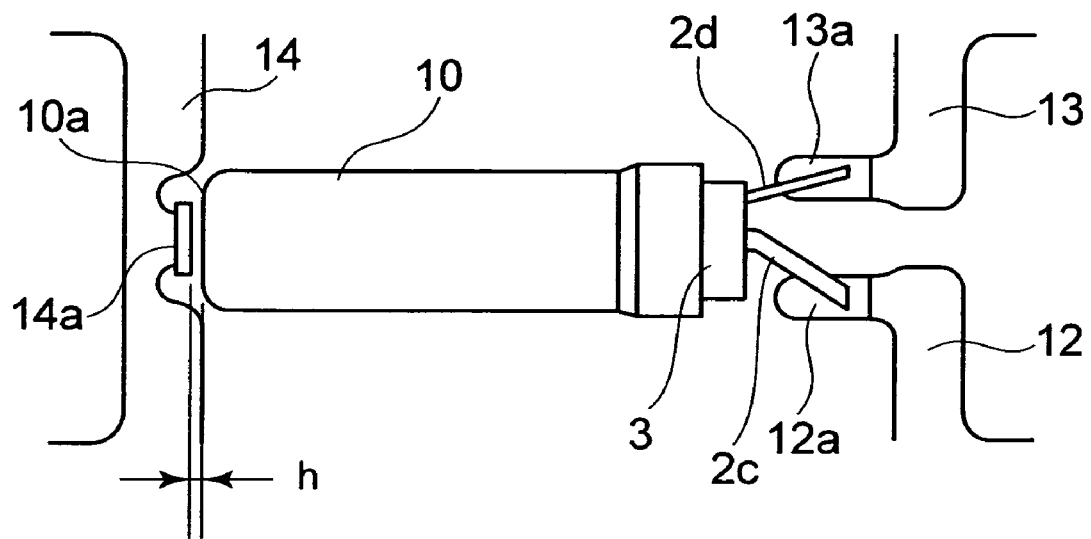
FIGS. 2A and 2B illustrate outline views showing bonding of the piezoelectric vibrator showing the first embodiment and an external electrode terminal.
Figure 2B:
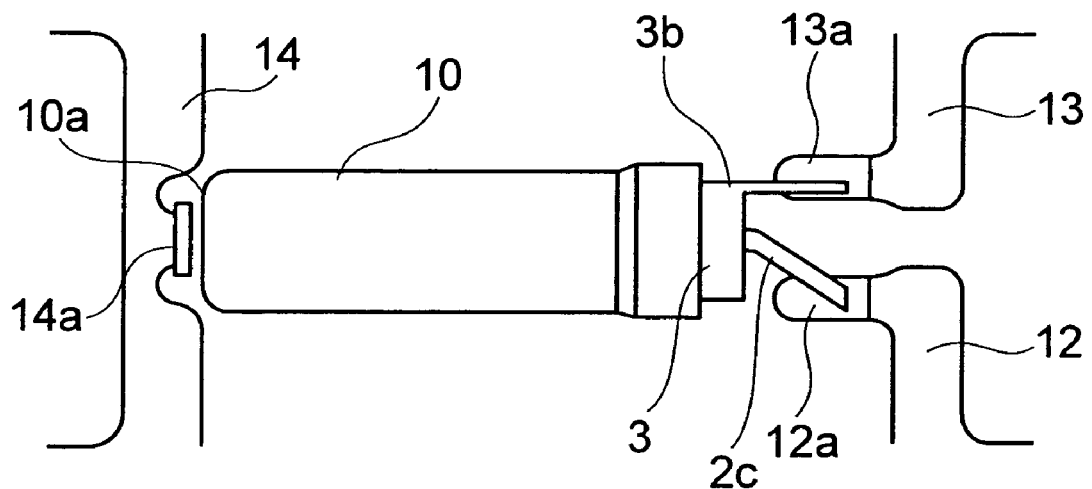

FIGS. 2A and 2B show outlines of a constitution when arranged to a lead frame having an external electrode terminal for covering the piezoelectric vibrator shown in FIGS. 1D, 1F by a resin material.

In FIG. 2A, the pair of leads 2c, 2d of the airtight terminal are bent to be connected to connecting regions (referred to as connecting portions, and respectively designated by notations 12a, 13a) for external electrode terminals 12, 13 arranged in parallel with each other contiguously to one side on a lead frame. According to the airtight terminal of the related art, the leads are arranged symmetrically relative to the center line of the stem and therefore, the outer leads are widened to open legs symmetrically relative to the center line. According to the embodiment, the pair of first lead and the second lead are arranged asymmetrically relative to the center line of the stem. Therefore, the respective outer leads need to be bent by a jig or the like having a pertinent radius of curvature.

FIG. 2B shows a case of similarly arranging the piezoelectric vibrator shown in FIG. 1F. There is constructed a constitution of connecting the second protruded portion to the connecting portion 13a of the second external electrode terminal.

Further, according to the embodiment, the case 10 of the piezoelectric vibrator is constituted by a structure of being electrically conducted to an exciting electrode by way of the stem and therefore, the case 10 needs to be constituted by a structure of not brought into mechanical contact with a third external electrode terminal 14 (dummy electrode). That is, the third external electrode terminal 14 is fixedly attached by a molded resin. According to a mold structure of the related art, the case is brought into an electrically floating state and therefore, even when brought into mechanical contact with the third external electrode terminal, no problem is posed in an electric property of a vibrator. According to the embodiment, in order to prevent mechanical contact, an interval (designated by notation h in FIG. 2A) between an erected portion 14a of the third external electrode terminal 14 and an outer side 10a of a bottom face of the case 10 is set to about 250 μm. Specifically, it is necessary to determine the interval in consideration of a variation (which is designated by ΔL) in a capping height when the case is capped to the stem, a variation (which is designated by ΔS) from a vertical face inherently brought about in bending the erected portion 14a of the third external electrode terminal above the lead frame, a variation (which is designated by ΔM) by an error of a position when the vibrator is arranged above the lead frame and so on. In typical numerical examples, ΔL is about 100, and ΔS and ΔM are about 50 μm. Therefore, a total of the three variations constitute 200 μm. 50 μm is added thereto as a numerical value of allowance. In the case of molding by a resin, it is necessary that a resin material is sufficiently brought into a space between the erected portion 14a and the outer side 10a of the bottom face of the case and the allowance of about 50 μm seems to be proper.

The resin material is determined in consideration that void, crack, exfoliation are not brought about in molding, that deformation, crack or the like is not brought about in mounting a board in reflow or the like, and a condition of reliability of moisture resistance at high temperatures.

Further, particularly in injection molding, a temperature of heating a resin (so-to-speak molding cylinder temperature) is generally higher than that of transfer mold. Therefore, in injection molding, when a resin is made to flow at inside of a die, by an influence of heat provided to the flowing resin and an influence of operation of mechanical abrasion brought about between the injected flowing resin and the airtight terminal, shortcircuit is liable to be brought about between the leads or between the lead and the stem by melting the surface of plating on the airtight terminal and moving the melted object. Therefore, it is necessary to pertinently set a position of introducing the resin (gate) and select a resin material in excellent in fluidity even when the molding cylinder temperature is low.

Figure 3:
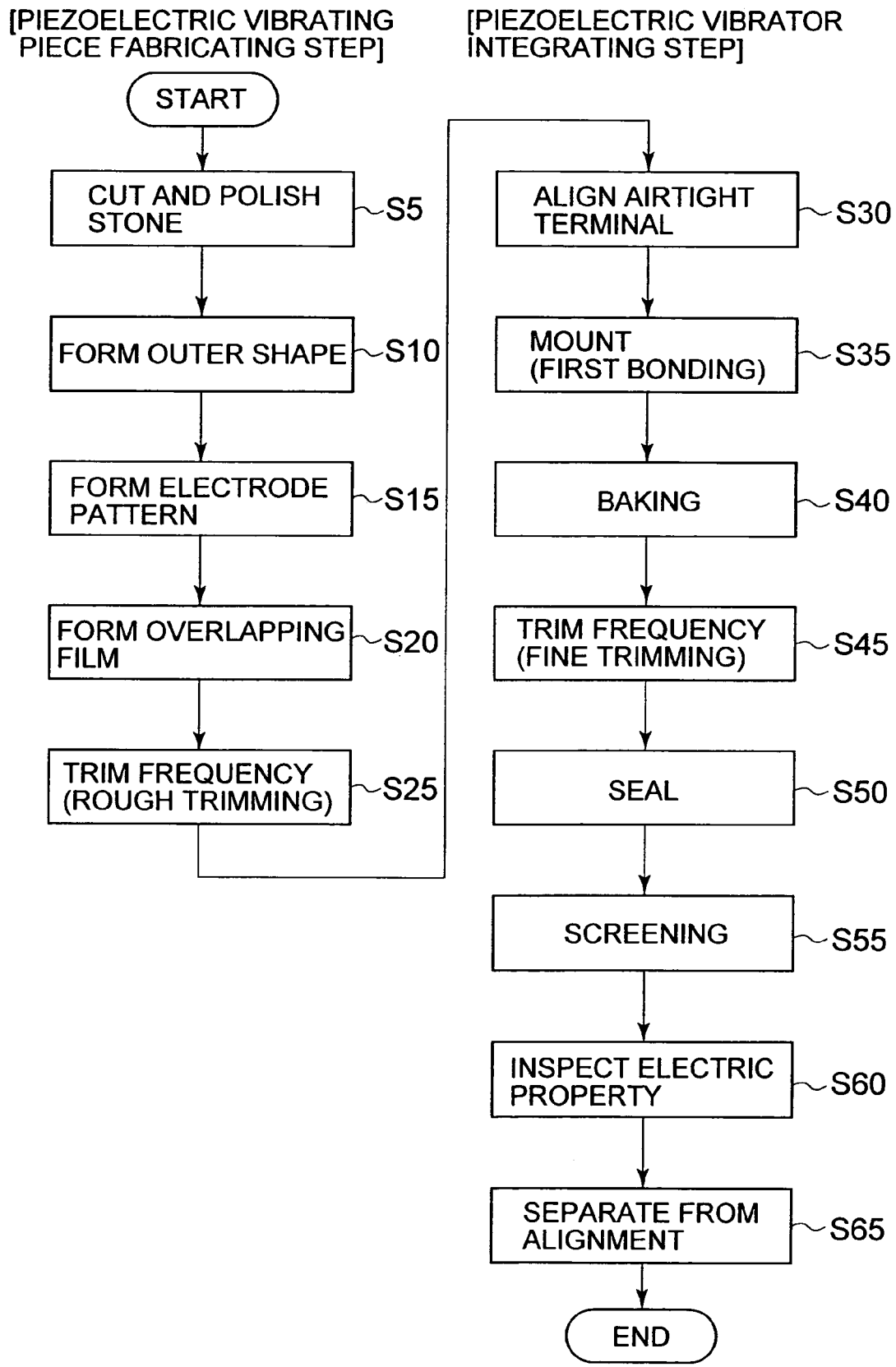
FIG. 3 is a fabrication flowchart of steps of fabricating and integrating a piezoelectric vibrating piece for fabricating the piezoelectric vibrator according to the first embodiment.

Here, a concise explanation will be given of a method of fabricating a piezoelectric vibrator in reference to a fabrication flowchart shown in FIG. 3 and FIG. 4.

Piezoelectric Vibrating Piece Fabricating Step

In steps of fabricating the piezoelectric vibrating piece, first, after setting lumbert stone of quartz on a worktable to constitute a predetermined cutting angle by also using an X-ray diffraction method, for example, by a cutting apparatus of a wire saw or the like, the quartz is sliced to cut to a thickness substantially 200 μm. Next, a wafer is polished to a constant thickness. Thereafter, after removing a work alterated layer by etching the surface, polishing and cleaning is carried out to finish the wafer to a mirror face having a predetermined thickness and a predetermined flatness (step 5).

Successively, by using film forming means of sputtering or the like, a metal thin film for a mask is deposited by a predetermined film thickness. The thin films are deposited on both faces of the wafer. Next, a mask for an outer shape of the tuning fork type vibrator is formed by lithography technology. By etching quartz by an aqueous solution of fluoric acid species by using the mask of the metal thin film, a plurality of outer shapes are formed on the wafer (step 10).

Thereafter, all of the metal film used as a mask is temporarily exfoliated. After exfoliation, metal thin films constituting electrode films by a predetermined film thickness are deposited on both faces of the wafer by film forming means of sputtering or the like. After depositing the films, patterns of the electrode films are formed by using lithography technology (step 15).

Next, a metal film for overlapping is formed at a region of a front end of the vibrating arm by a thickness of several micrometers, which serves as a weight (step 20). Successively, by irradiating laser or the like to the overlapping portion in the atmosphere, while measuring an oscillation frequency, a portion of the deposited metal film for overlapping is evaporated, and a frequency is tuned into a predetermined rough range (step 25). By the above-described steps, the wafer having a plurality of the piezoelectric vibrating pieces is finished.

Piezoelectric Vibrator Integrating Step

A plurality of pieces of the airtight terminals 1 according to the invention are aligned at a pallet constituting a jig for flowing of an integrating step (step 30). Successively, as a first bonding step, a mounting step is carried out (step 35). The piezoelectric vibrating piece fabricated in accordance with the above-described and the inner lead of the airtight terminal are bonded. In the mounting step, first, the piezoelectric vibrating piece 6 is cut off from a connecting portion of connecting the individual piezoelectric vibrating pieces and the wafer by laser or mechanical means, thereafter, positioned to the inner lead 2a. Next, the plating film of the inner lead 2a is melted by applying heat from outside and the inner lead 2a is bonded to the mount pad 9 formed above the piezoelectric vibrating piece 6. As means for melting the plating film, heating by laser or a light source, or arc discharge heat can also be utilized. Or, the piezoelectric vibrating piece 6 can also be connected thereto by an electrically conductive adhesive or the like without utilizing the plating film of the inner lead 2a. Further, bonding by flip chip bonder can also be carried out.

After the mounting step, at inside of a vacuuming apparatus, baking is carried out by heating at a predetermined temperature to remove strain produced in the mounting step (step 40).

Next, a frequency trimming step (fine frequency trimming) is carried out. While measuring the oscillation frequency by probing the outer lead 2b by being transported to the vacuum apparatus pallet by pallet, laser is irradiated to an overlapping portion 6b of the vibrating arm of the piezoelectric vibrating piece, a metal film for adjustment is evaporated, and the frequency is trimmed (step 45). Thereafter, a plurality of pieces of the pallets having the piezoelectric vibrating pieces whose frequencies have been trimmed are aligned at inside of the die and aligned to be opposed to the cases 10 for sealing. Sufficient vacuum heating is carried out at inside of a sealing apparatus for desorbing moisture or gas component adsorbed in the steps before sealing. After heating, the case is capped thereto to seal inside of the case 10 in airtight in vacuum (step 50). Airtightness is maintained by the case 10 designed to be tightly fitted to the plating film which is a soft metal at the outer ring of the stem. Thereafter, screening is carried out at a predetermined temperature with an object of stabilizing the oscillation frequency (step 55).

After the screening, electric properties of an oscillation frequency, the resonance resistance value and the like of the piezoelectric vibrator are inspected by an electric property inspecting apparatus. In the electric property inspection, the outer lead 2b of the piezoelectric vibrator is probed and the respective properties are measured (step 60).

After finishing the measurement, the piezoelectric vibrator is detached from the pallet by using a jig (step 65). By the above-described steps, the tuning fork type quartz crystal vibrator having the shape of the bottomed cylinder is finished.

Further, although in the frequency trimming step and the electric property inspecting step, in the related art, the electric properties can be measured by probing the pair of outer leads, there is also included a case of a single piece of the outer lead according to the vibrator of the invention. In that case, the electric properties can be measured by probing the stem or the case.

Resin Molding Step

Next, an explanation will be given of a step of molding the vibrator 40 of the bottomed cylinder type fabricated by the above-described steps of integrating the piezoelectric vibrator by a resin. A description will be given thereof based on the fabrication flowchart shown in FIG. 4.

An electrically conductive material is selected for an exclusive lead frame 11, the lead frame 11 is subjected to drawing or etching, the external electrode terminals 12, 13 having the bent portions are formed by further bending, and the external electrode terminal 14 having the erected portion is arranged at an opposed position (step 70). The vibrator 40 is supplied to the lead frame 11 prepared in this way and is positioned (step 75). Successively, the outer lead or the second protruded portion is formed and the outer lead having an extra length is cut (step 80). Successively, the outer electrode terminals 12, 13 and the outer lead or the second protruded portion of the airtight terminal in correspondence therewith are pinched by an upper die and a lower die, welded by resistance welding or the like and a bonded state is inspected after bonding (step 85). In the bonding, second bonding is constituted by bonding of the outer lead of the airtight terminal and the first external electrode terminal 12 in correspondence therewith, and third bonding is constituted by bonding of a surface of the piezoelectric vibrator electrically conductive to the stem of the airtight terminal and the second external electrode terminal 13. The second bonding and the third bonding may simultaneously be carried out or may be carried out separately.

Next, an outer shape of a predetermined molded product is formed by molding by transfer mold or injection molding (step 90). Successively, a surface of the molded resin is marked by printing or laser (step 95). Thereafter, thin burrs of the resin 30 produced in molding are removed (step 100), successively, the external electrode terminals 12, 13 and the external electrode terminal 14 are plated with a plating film, not illustrated, by a thickness of, for example, substantially 5 through 15 μm by being put into a plating tank along with the frame 11 (step 105). Further, the operation can be omitted when the lead frame 11 is previously formed with a plating film.

Next, the resin molded product is cut from the lead frame 11 to be separated to pieces (step 110). Successively, electric properties of the resonance frequency and the resonance resistance value and the like of the vibrator are inspected (step 115).

After having been processed by the above-described steps, the piezoelectric vibrator (surface mounting type piezoelectric vibrator) molded by the resin is finished.

Figure 5A:
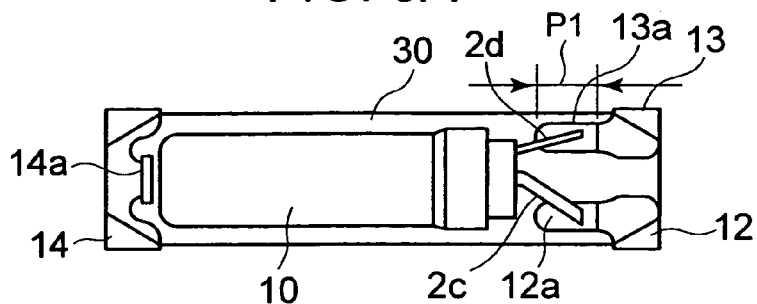
FIGS. 5A to 5G illustrate outline constitution views of a molded product showing the first embodiment.
Figure 5B:
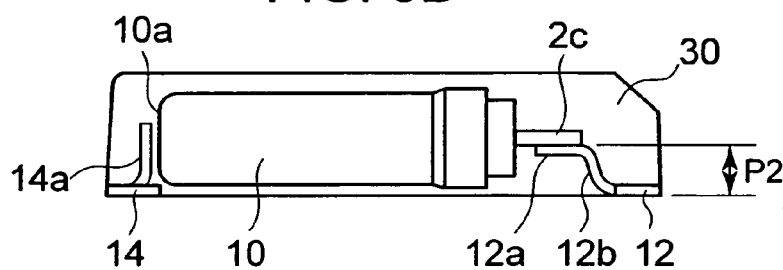
Figure 5D:
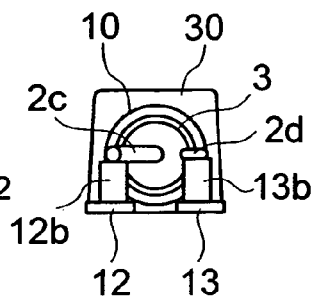
Figure 5C:
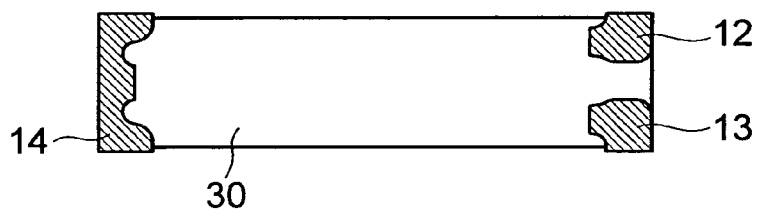

FIGS. 5A to 5G illustrate outline constitution views of a part molded by such resin molding steps. In FIGS. 5A, 5B, 5C, 5D, the piezoelectric vibrator shown by FIG. 2A is molded, FIG. 5A shows a plane view, FIG. 5B shows a front view, FIG. 5C shows a bottom view, FIG. 5D shows a right side view. Here, the resin 30 is constituted by a transparent member and only an outer shape line is indicated by a bold line (however, the resin is made to be intransparent in the bottom view). Further, the resin is indicated by the transparent member also in drawings of other embodiment showing a molded part.

The external electrode terminals 12, 13 and 14 of the molded part are cut to be separated from the lead frame by predetermined dimensions and constituted by structures of being exposed to outside of the molded part. The outer shape of the resin is subjected to a large C facing at the external electrode terminal portion, as is apparent from the plane view 5A, constituted by a structure in which the terminal portion 12c, 13c, and 14c of the external electrode terminals are seen from an upper face, and constituted by a structure of enlarging a mounting area and capable of monitoring wetting of an solder or the like on a fabrication line. The outer lead 2c of the first lead of the piezoelectric vibrator is bonded to the external electrode terminal at the connecting portion 12a. The outer lead 2d of the second lead is bonded at the connecting portion 13a of the external electrode terminal similarly. Here, the respective outer leads are disposed at inside of a horizontal face the same as that of the center of the bottomed cylinder type piezoelectric vibrator and is constituted by a structure in which the terminal portions 12c, 13c are exposed respectively at the bottom face from the connecting portions by way of the bent portions 12b, 13b in the crank-like shape.

On the other hand, the external electrode terminal 14 arranged at the position opposed to the external electrode terminals 12, 13 is constituted by an insert molding structure having the erected portion 14a at inside of the resin 30. Here, as described above, the pertinent clearance is provided between the erected portion 14a and the bottom face (outer side) of the case 10 of the piezoelectric vibrator, and the case and the external electrode terminal 14a are not brought into contact with each other.

Figure 5E:
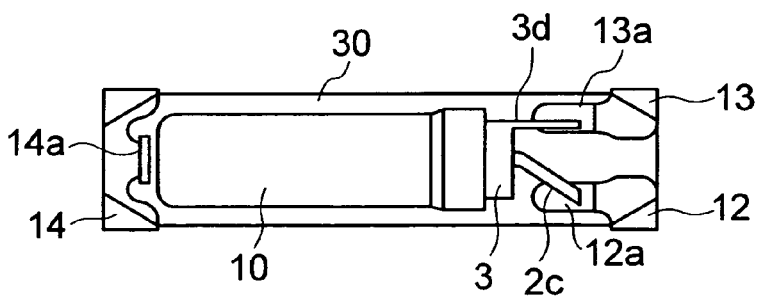
Figure 5F:
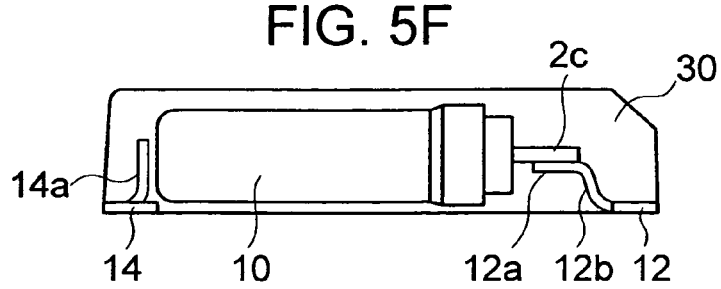
Figure 5G:
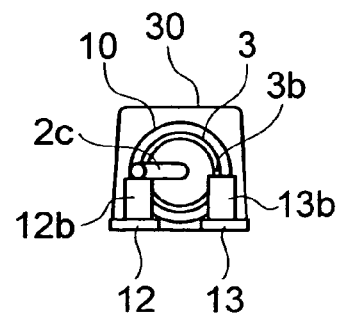

FIGS. 5E, 5F, 5G are outline constitution views of a molded part of the piezoelectric vibrator shown in FIG. 2B. FIG. 5E is a plane view, FIG. 5F is a front view, FIG. 5G is a right side view. The second protruded portion 3b extended from the stem 3 to the side of the outer lead is bonded to the second external electrode terminal 13 at the connecting portion 13a. Here, as shown by the right side view 5G, the position of bonding the second protruded portion 3b can be arranged at a height substantially the same as that of the first lead 2c, when means of spot welding or the like is utilized, control of dies is facilitated, which is preferable. The other constitution is the same as that of the above-described case and therefore, the other constitution will be omitted.

Embodiment 2

An explanation will be given of a structure of molding a piezoelectric vibrator using an airtight terminal constituted such that only a first lead comes out from a side of a filling member on a side of an outer lead in reference to the drawings as a second embodiment of the invention.

Figure 6A:
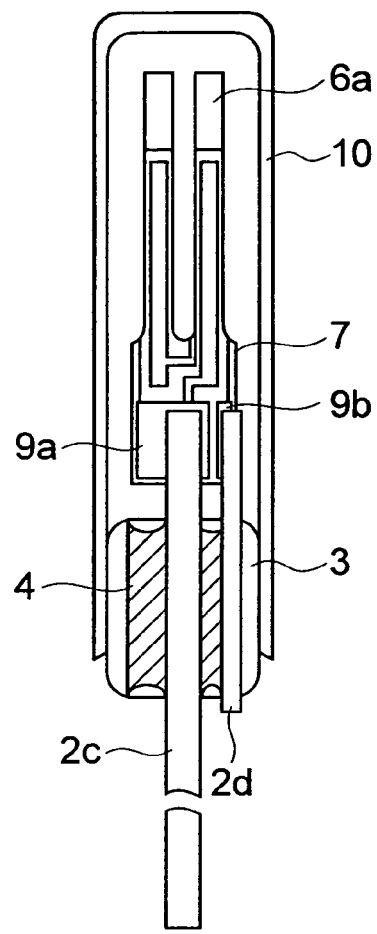
FIGS. 6A and 6B illustrate outline constitution views of a piezoelectric vibrator constituting a second embodiment.

FIG. 6A shows an inner structure of a piezoelectric vibrator which includes a first and a second lead on a side of an inner lead in which the second lead is integrated by using an airtight terminal brought into mechanical contact with a stem and electrically conductive thereto. The first lead fixed by penetrating a filling member comes out to a side of an outer lead. However, the second lead is constituted by a structure in which more or less dimension thereof comes out to the side of the outer lead from a bottom face of a stem. This is owing to reason that in steps of integrating the airtight terminal, it is advantageous in view of integrating steps that the second lead is exposed to the side of the outer lead by penetrating the filling member. The structure is not constituted with an intention of electrically connecting the exposed portion to be used.

Figure 6B:
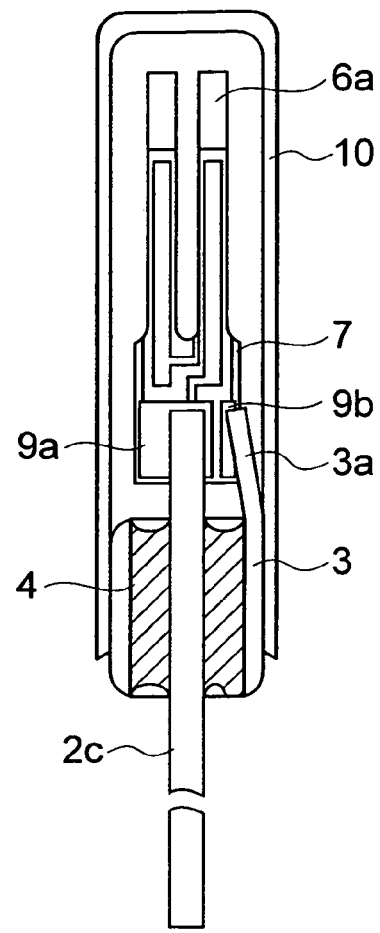

In FIG. 6B, a first protruded portion is formed by protruding a portion of an outer periphery of the stem from a side of the inner lead of the stem and is connected to a mount pad of the piezoelectric vibrating piece. Only the first lead fixed by penetrating the filling member comes out to the side of the outer lead.

Figure 7:
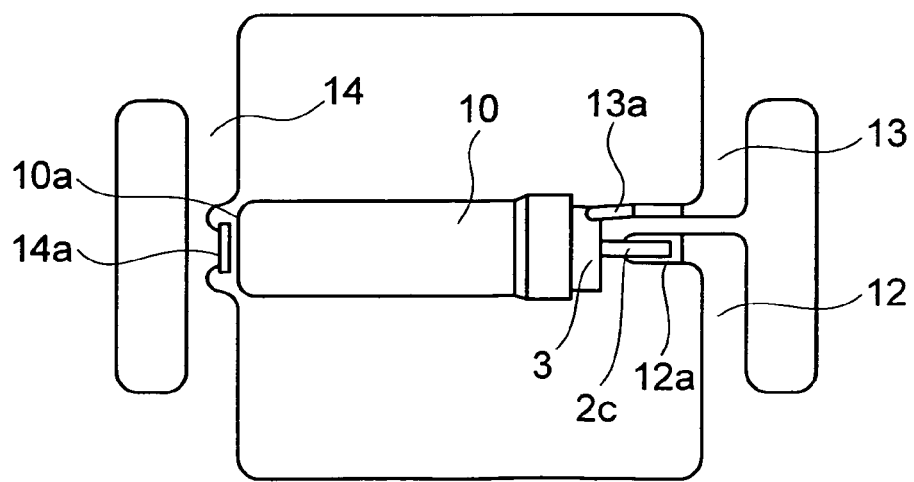
FIG. 7 is an outline view showing bonding of the piezoelectric vibrator showing the second embodiment and an external electrode terminal.

FIG. 7 is a drawing in which the piezoelectric vibrator having the constitution shown in FIGS. 6A and 6B is arranged at a lead frame previously provided with an external electrode terminal. Here, the first lead 2c fixed by penetrating the filling member is bonded to the connecting portion 12a of the first external electrode terminal. At other of the second external electrode terminal 13 formed on the lead frame, the bent portion 13b is extended to one end of the stem 3 of the airtight terminal and is bonded to an outer peripheral face of the stem at the connecting portion 13a.

In this way, by extending the second external electrode terminal on the side of the lead frame to the stem to be bonded to thereby achieve electric conduction, the side of the outer lead of the second lead of the airtight terminal can be dispensed with.

Although according to the embodiment, the case of bonding the external electrode terminal and the stem is shown, the external electrode terminal can also be bonded to the case. However, although the bonded portion is small, in order to build up the bonding portion, it is requested to devise that recesses and protrusions are not constituted at the surface after molding. Therefore, it is preferable to provide the bonding portion at a side face of the stem disposed on the inner side by an amount of a plate thickness of the case as shown by FIG. 7 or a bottom face thereof.

After arranging the piezoelectric vibrator to the lead frame in this way, a molded product can be fabricated in accordance with the above-described steps of molding the resin. The finished molded product is shown in FIGS. 8A to 8C.

Figure 8A:
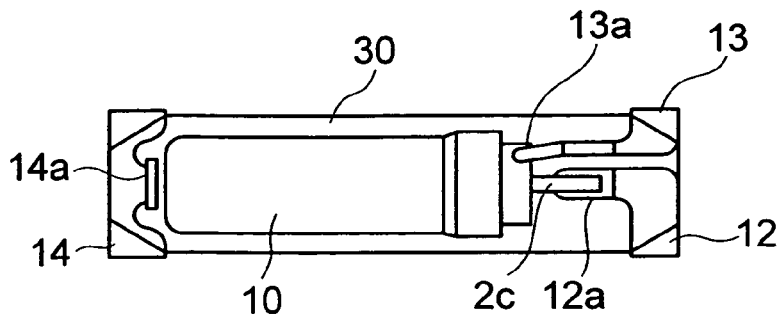
FIGS. 8A to 8C illustrate outline constitution views of a molded product of the second embodiment.
Figure 8B:
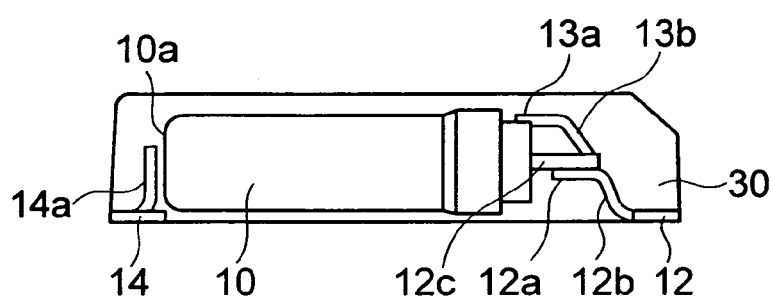
Figure 8C:
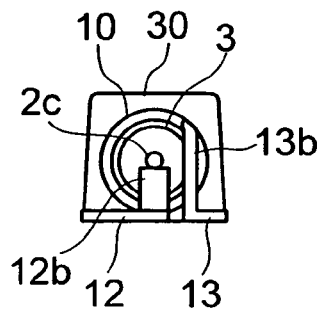

FIGS. 8A, 8B, 8C respectively show a plane view, a front view, a right side view of a molded part. Here, as shown by the front view 8B, the second external electrode terminal 13 includes the bent portion 13b extended in comparison with the first external electrode terminal 12 and is extended to a side face of the stem. Further, as shown by the right side view 8G, the position of the connecting portion 13a of connecting the stem and the external electrode terminal is set not to the upper face of the stem but to a position, for example, rotated in the clockwise direction by about 45° from the upper face. Thereby, the resin can be prevented from being built up at the bonding point, further, an increase in the length of the bent portion of the second external electrode terminal is minimized. The other structure is similar to that of Embodiment 1 and therefore, an explanation thereof will be omitted.

According to Embodiment 1 and Embodiment 2 mentioned above, there is constituted a structure of capable of bonding a pair of leads or the first lead and the second protruded portion of the piezoelectric vibrator of the bottomed cylinder type to the first and the second external electrode terminals provided at the lead frame by an extremely short distance. Therefore, a difference of an equivalent circuit constant before and after the molded part can be restrained to be low.

Embodiment 3

As a third embodiment of the invention, an explanation will be given of a case bonded with a connecting member of an electrically conductive material on an outer side of a bottom face in a cylindrical shape in a case having a bottomed cylinder shape forming an airtight space by pairing with an airtight terminal having a stem in a ring-like shape and a lead comprising an electrically conductive material arranged to penetrate inside of the stem.

An intension of the invention shown in the embodiment resides in that by previously bonding a connecting member to an outer side of the bottom face of a case, when a piezoelectric vibrator is arranged at the lead frame, a step of bonding the connecting member and an external electrode terminal is facilitated.

Figure 9A:
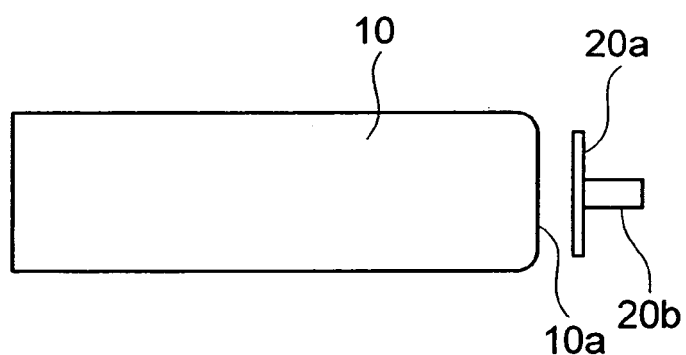
FIGS. 9A and 9B illustrate outline views showing a third embodiment.
Figure 9B:
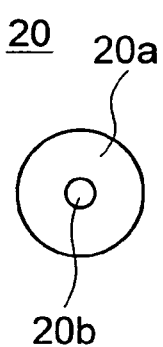

FIGS. 9A and 9B show examples of shapes of a case and a bonding member. A connecting member 20 shown in FIG. 9B comprises a base portion 20a and a lead portion 20b. As shown by FIG. 9A, the base portion 20a is bonded to the bottom face 10a of the case. On the other hand, the lead portion is connected to the external electrode terminal as mentioned later.

A material of the connecting member 20 is preferably a material having a thermal expansion coefficient near to that of the case 10. A product is exposed to an atmosphere in a temperature range of from about −40° C. on a low temperature side to about 260° C. determined by a reflow processing on a high temperature side. There is commonly used nickel silver (Ni—Cu—Zn alloy) excellent in a deep drawing property, a spring property (which is needed in fitting with the stem) at high temperatures and corrosion resistance for the case, and a surface thereof is formed with Ni plating by several μm at a maximum. Therefore, a nickel silver member is preferable for the connecting member.

Further, it is preferable to previously form a plating film at a surface of the connecting member. Other than Ni plating, for example, solder plating of Sn—Cu (tin copper alloy), Sn—Bi (tin bismuth alloy), Au—Sn (gold tin alloy) or the like is preferable.

Next, a concise description will be given of a method of bonding the electrically conductive connecting member 20 to the outer side of the case bottom face 10a by taking an example. A diameter of the bottom face of the case is equal to or smaller than about 1 mm in the case of a small-sized vibrator and therefore, a diameter of the base portion 20a of the connecting member 20 is provided with a dimension of about 600 through 800 μm, on the other hand, a diameter of the lead portion 20b is selected to be about 200 μm. After positioning the base portion 20a of the connecting member and the case bottom face 10a, contact faces thereof are brought into close contact with each other by exerting a pertinent force and bonded by means of spot welding, laser welding or the like (not illustrated). At this occasion, it is preferable that a force (tensile strength) of bonding the connecting member 20 and the case bottom face 10a is provided with a strength equal to or larger than about 5 N and it is preferable that also a shear force of bonding is provided with a value equal to or larger than 20 N.

Embodiment 4

In embodiment 4 of the invention, a description will be given of a piezoelectric vibrator using a case having a connecting member shown in Embodiment 3 and a mold structure thereof.

Figure 10:
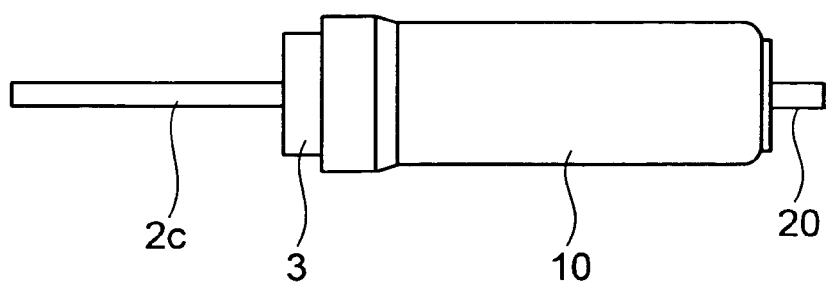
FIG. 10 is an outline view of a piezoelectric vibrator showing a fourth embodiment.

After preparing the case having the connecting member as described above, the case is inserted into an airtight terminal fixedly attached with a piezoelectric vibrating piece to form a piezoelectric vibrator. This is shown in FIG. 10. The pair of exciting electrodes of the piezoelectric vibrating piece are connected to the first lead 2c penetrating the stem 3 and the connecting member 20 at a front end of the case 10 respectively.

Successively, the piezoelectric vibrator shown in FIG. 10 is arranged at a lead frame. This is shown in FIGS. 11A to 11F.

Figure 11A:
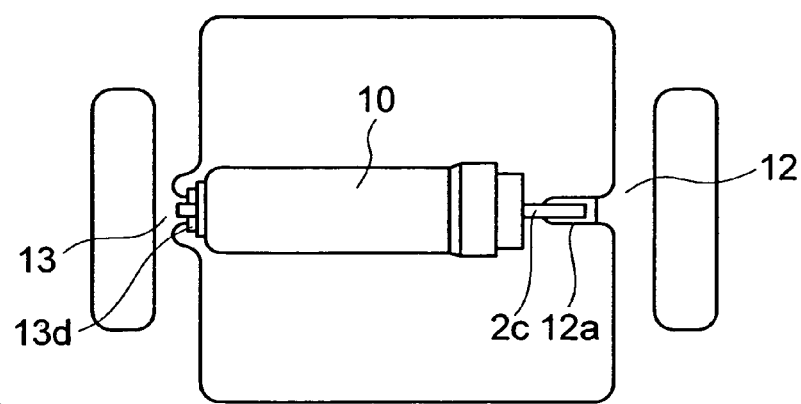
FIGS. 11A to 11F illustrate outline views showing bonding of the piezoelectric vibrator showing the fourth embodiment and an external electrode terminal.
Figure 11C:
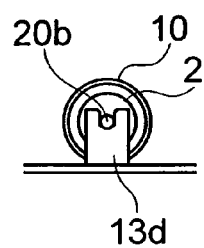
Figure 11B:
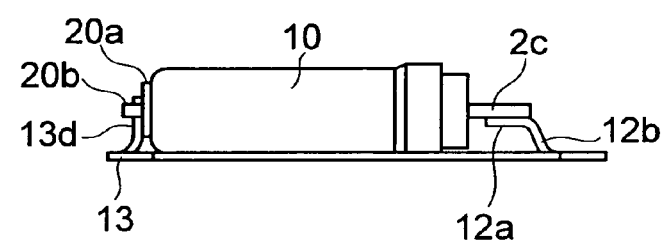

FIGS. 11A, 11B, 11C are respectively a plane view, a front view, a left side view. The lead frame is arranged with the first external electrode terminal 12 and the second electrode terminal 13 to be opposed to each other. The third external electrode terminal shown in Embodiment 1 and Embodiment 2 is not needed in the embodiment. The first lead 2c and the connecting portion 12a of the first external electrode terminal are bonded, and the bonding is the same as bonding of the related art and therefore, an explanation thereof will be omitted.

On the other hand, bonding of the connecting member 20 at the bottom face of the case and the second external electrode terminal 13 will be explained in reference to the front view 11B and the left side view 11C. The connecting member 20 and the connecting portion 13a of the second external electrode terminal are mechanically positioned. According to the embodiment, there is constituted a structure of providing the erected portion 13d at the second external electrode terminal and providing a recess portion in correspondence with the lead portion 20b of the connecting member 20 at the erected portion 13d. Further, there is constituted a structure of providing a slit at a lower face of the recess portion and having spring performance. Thereby, the lead portion 20b is constructed by a constitution of being solidly held by being mechanically positioned by the recess portion. When the lead portion 20b is provided with coating of plating, it is possible to constitute a structure in which the face of the recess portion firmly bites the plating film. Further, when the both members are bonded by means of laser welding or the like, the both members can further firmly be connected.

Figure 11D:
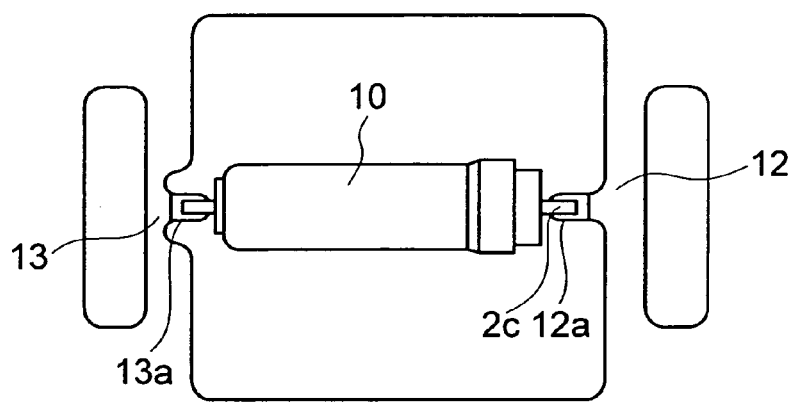
Figure 11F:
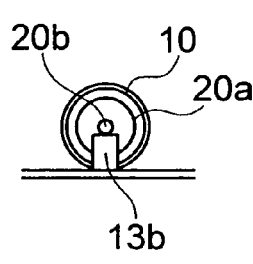
Figure 11E:
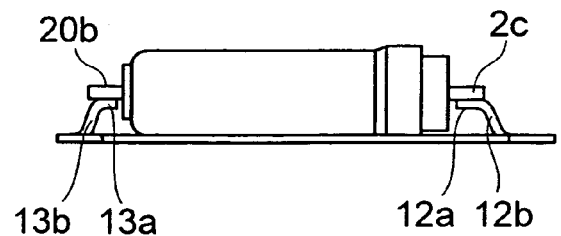

FIGS. 11D, 11E, 11F show a modified example. The respective drawings are respectively a plane view, a front view, a left side view. According to the modified example, for bonding the connecting member 20 and the second external electrode terminal, there is adopted a constitution which is substantially symmetrically with bonding of the first lead 2c and the first external electrode terminal. That is, as shown by the front view 11E, the second external electrode terminal 13 includes the bent portion 13b to be opposed to the first external electrode terminal 12 and is connected to the lead portion 20b of the connecting member by the connecting portion 13a. At this occasion, a length of the first lead 2c, lengths of the connecting portions 12a, 13a are pertinently set such that a dimension in a longitudinal direction of a molded part is not prolonged. According to the modified example, the first lead and the lead 20b of the connecting member can simultaneously be bonded to the connecting portions of the external electrode terminals respectively in correspondence therewith by means of spot welding or the like.

After arranging the piezoelectric vibrator to the lead frame in this way, the molded product can be fabricated in accordance with the above-described steps of molding the resin. A finished molded part is shown in FIG. 12A to 12G.

FIGS. 12A, 12B, 12C show an example of molding the piezoelectric vibrator shown in FIGS. 11A, 11B, 11C. FIG. 12A is a front view, and FIGS. 12B, 12C are respectively a right side view, a left side view.

FIGS. 12D, 12E, 12F, 12G show a molded part of the above-described modified example. FIG. 12D is a plane view, FIG. 12E is a front view, FIG. 12F is a bottom view, FIG. 12G is a right side view.

By arranging the external electrode terminals to be opposed to each other in this way, a fixedly attaching strength can be increased by enlarging an area mounted to a board. For example, according to Embodiment 1 and Embodiment 2, two of the electrode terminals having different polarities are arranged in parallel on one side and therefore, a constant interval is needed between the terminals, and the terminal area needs to be restricted considerably. Taking an example of a current molded part, a lateral width of the part is about 1.5 mm and an area of one piece of the electrode terminal becomes about 0.1 $mm^2$. When the area is compared with a total floor area of the molded part, the area is about one hundredth thereof. On the other hand, when the external electrode terminals arranged at a bottom face of the molded part to be opposed to both ends thereof as in the embodiment as shown by FIG. 12F, the fixedly attaching strength can be increased by enlarging an electrode area. Even when the lateral width of the molded part is assumedly 1 mm, an area of one piece of the electrode terminal can be designed by about 3 times as much as the terminal area of 0.1 mm$^2$ and a sufficient strength can be ensured.

According to the embodiment, the description has been given of the mold structure of the piezoelectric vibrator sealed by using the case previously provided with the connecting member. However, as an order of bonding the connecting member to the case, the connecting member can also be bonded to the bottom face of the case of the piezoelectric vibrating member finished with sealing regardless thereof. In the latter case, in a capping step, as a pressing plate for realizing fitting of tight fitting by pressing the bottom face of the case, since there is not the connecting member at the bottom face of the case, a flat plate can be utilized as it is, which is preferable. In the future, there will be adopted, on the outer periphery of the stem, plating of, for example, plating of a tin copper alloy (Sn—Cu), plating of a tin copper silver alloy (Sn—Cu—Ag) or the like eliminating lead from plating of a tin lead alloy (Sn—Pb) of the related art and therefore, hardness of plating is liable to be increased. Therefore, a higher capping force is needed. Therefore, according to a system of capable of pressing a total of the bottom face of the case, there is not a concern of producing deformation of local dent or the like of the bottom face of the case by locally applying a pressing force to a corner portion of the bottom face of the case and smoother capping can be carried out.

Embodiment 5

A diameter of the case of the small-sized piezoelectric vibrator anticipated in the future is anticipated to be smaller than the dimension of 1 mm and to be reduced from 0.8 mm to about 0.5 mm. Therefore, a heat capacity of the piezoelectric vibrator including the case and the airtight terminal is sufficiently small, by pertinently selecting working means, the case can directly be bonded to the second external electrode terminal to stay in the mode of a package of the piezoelectric vibrator finished to be integrated without bonding the connecting member shown in Embodiment 3 and Embodiment 4 to the case.

FIGS. 13A to 13G show examples of arranging the piezoelectric vibrator to the lead frame. The piezoelectric vibrator is a vibrator having the structure of FIGS. 6A and 6B. That is, the pair of exciting electrodes of the piezoelectric vibrating piece are connected to the first lead 2c and the case 10. Connection of the first lead and the first lead external electrode terminal is the same as the above embodiments and therefore, an explanation thereof will be omitted. An explanation will be given as follows of a method of connecting the case 10 and the second external electrode terminal (a constitution of a portion indicated in a circle of a dotted line in FIG. 13A).

Figure 13A:
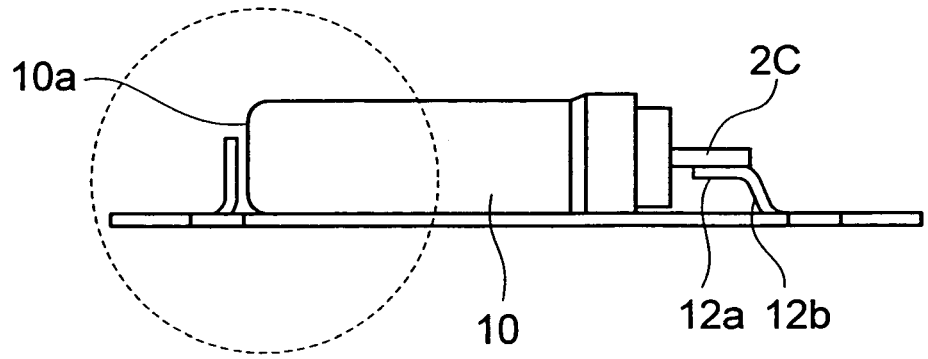
FIGS. 13A to 13G illustrate outline views showing bonding of a piezoelectric vibrator showing a fifth embodiment and an external electrode terminal.
Figure 13C:
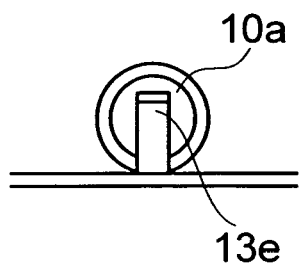
Figure 13B:
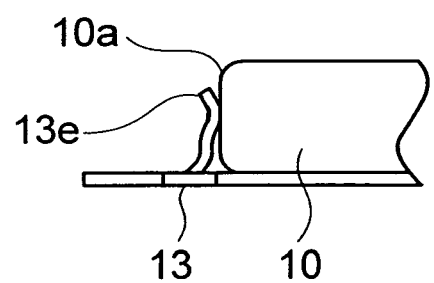

As a first example, FIG. 13B and FIG. 13C show an example of deforming the erected portion 13d of the external electrode terminal 13 to provide spring performance (designated by notation 13e). FIG. 13C is a left side view of FIG. 13B. The erected portion 13e having the spring performance is brought into contact with the bottom face of the case at a vicinity of a center of the bottom face 10a of the case by providing a pertinent pressure. Under the state, there is constituted a structure of capable of constituting firm contact mechanically and electrically by subjecting the vicinity of the center to laser welding or the like.

Figure 13E:
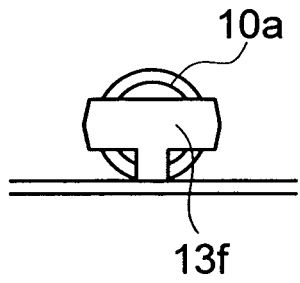
Figure 13D:
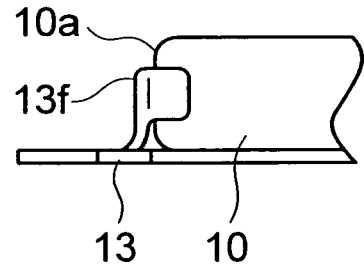

As a second example, a modified example of the second external electrode terminal is shown in FIG. 13D and FIG. 13E. FIG. 13E is a left side view of FIG. 13D. Here, the erected portion 13d is constituted by a structure of holding an outer shape of the case and is designated by notation 13f. Also in this case, the case is mechanically held by pertinently designing an interval and a dimension of claws at both ends of the erected portion 13f, and after holding the case, further firm connection is constituted by bonding the erected portion 13f and the case bottom face 10a or a case side face by means of laser welding or the like.

Figure 13G:
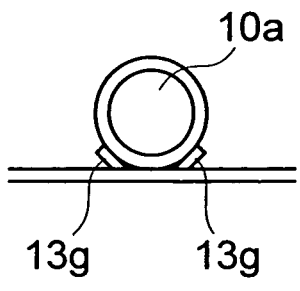
Figure 13F:
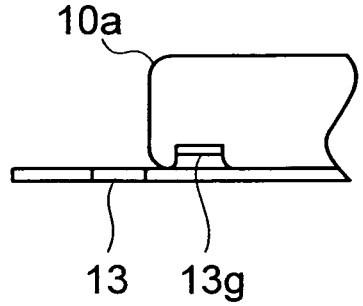

As a third example, FIG. 13F and FIG. 13G show other modified example of the second external electrode terminal. FIG. 13G is a left side view of FIG. 13F. In this case, the erected portion is not formed and there is constituted a structure having a claw 13g in a V-like shape brought into contact with a side face of the case for positioning and mechanically holding and electrically connecting the case. In connecting the claw 13g in the V-like shape and the side face of the case 10, spot bonding can be carried out by local working means of laser welding or the like and also means of an electrically conductive adhesive or the like can also be used.

The piezoelectric vibrator arranged at the lead frame by the above-described method is molded in accordance with a flow of molding steps. FIGS. 14A to 14G show examples of molded parts in correspondence with the three examples shown in FIGS. 13A to 13G.

FIGS. 14A, 14B, 14C are respectively a front view, a right side view, a left side view and correspond to the first example. As described above, the first lead 2c is connected to the first external electrode terminal at the connecting portion 12a and is exposed to outside of the resin 30 as the external electrode terminal by way of the bent portion 12b. On the other hand, there is constructed the structure of connecting the bottom face 10a of the case and the erected portion 13e of the second external electrode terminal 13 having the spring performance. Also the second external electrode terminal is similarly exposed to outside of the resin 30 to constitute a structure of two electrode terminals opposed to each other.

FIGS. 14D, 14E show an example of a molded part in correspondence with the second example. FIG. 14E is a left side view of FIG. 14D. According to the example, it is necessary to devise such that a lateral width of the resin molded part is not increased by pertinently selecting a plate thickness of the erected portion 13f (which is equal to a plate thickness of the lead frame).

FIGS. 14F, 14G show an example of a molded part in correspondence with the third example. FIG. 14G is a left side view of FIG. 14F. According to the example, electric bonding with the case 10 is carried out by the claw 13g for positioning and holding the side face of the case and the external electrode terminal 13 is exposed to outside of the resin 30.

An explanation has been given of the five embodiments as mentioned above and the first and the second external electrode terminals 12, 13 are provided with the bent portions 12b, 13b in other four embodiments excluding Embodiment 3 for connecting the connecting member to the case. Here, a description will be given of an effect of providing the bent portion 12b, 13b in the longitudinal direction of the surface mount type piezoelectric vibrator and arranging the bent portion 12b, 13b at inside of the molded resin.

Two external electrode terminals are connected to the first lead 2c, the second lead 2d, or the second projected portion 3b of the bottomed cylinder type piezoelectric vibrator. In order to realize excellent electric connection, it is necessary to be firmly mechanically connected to the connecting portions 12a, 13a of the external electrode terminals. For that purpose, there is needed the connecting portion having a pertinent length and a pertinent width adapted to a diameter and a length of the lead or the projected portion. Notation P1 designates an example of a length of the connecting portion in FIG. 5A. When the bent portion of the external electrode terminal is assumedly provided in the width direction, there is needed an increase in the dimension in correspondence with the amount of the length of the connecting portion on both sides in the width direction. By providing the bent portion in the longitudinal direction as explained in the embodiment, the two bent portions can be arranged in parallel with each other and therefore, an increase in the dimension in the longitudinal direction is constituted only by an increase in the length of one piece of the connecting portion and therefore, a method further suitable for small-sized formation is constituted.

Next, a length (or a height) dimension of the bent portion of the external electrode terminal is set such that when the piezoelectric vibrator of the bottomed cylinder type is mounted to the lead frame and the first lead 2c, the second lead 2d, or the second projected portion 3b is arranged to the external electrode terminal in correspondence therewith, it is not necessary to bend the lead or the projected portion in a vertical direction. Notation P2 designates the length (height) of the bent portion in FIG. 5B. Therefore, the lead is restrained to bend only in a horizontal face, breakage of the lead in accordance with bending in the vertical direction is eliminated, and a crack is restrained from being induced in the filling member 4 of the stem 3 of the airtight terminal. In Embodiment 4 and Embodiment 5, it is not necessary to bend the first lead 2c even in a horizontal face and only a length thereof may be adjusted while being extended straight. It is apparent that breakage of the lead or the crack induced by the filling member 4 is extremely rare.

Further, since the bent portion is arranged at inside of the mold resin, the arrangement is advantageous for restraining a whisker of a plating film of the external electrode terminal which is provided in a later step from being brought about. When tin (Sn) plating or the like is adopted for the plating film, it is known that a whisker (needle-like projection) is brought about under a severe environment of a high temperature humid test, a heat impact test or the like. As a material of the lead frame of the surface mount type piezoelectric vibrator, in order to match a thermal expansion coefficient thereof to that of the lead material of the airtight terminal, an alloy having a low thermal expansion rate of an iron nickel alloy (for example, 42 alloy) or the like is adopted. Therefore, since the thermal expansion coefficient significantly differs from that of Sn of the plating film, particularly in a thermal impact test, compressive and tensile stresses are alternately produced at the Sn film and a long whisker is liable to be brought about. It is conceived that when there is a residual stress in a base material metal of a matrix of plating, generation of the whisker is further accelerated. Thereby, the constitution in which a portion subjected to bending as in the bent portion is disposed at inside of the resin and therefore, the constitution which needs not to form the plating film is very preferable in view of restraining generation of the whisker.

Embodiment 6

An explanation will be given of a modified example of the shape of the external electrode terminal of the surface mount type piezoelectric vibrator molded by the resin as a sixth embodiment of the invention in reference to FIGS. 15A to 15E.

FIGS. 15A to 15E illustrate views for explaining an example in which a sectional shape in a longitudinal direction of the external electrode terminal 12 is constituted by a channel-like shape. As shown by FIG. 15A, the lead 2c insulated from the stem of the piezoelectric vibrator of the bottomed cylinder type is connected to the external electrode terminal at the connecting portion 12a of the external electrode terminal in the channel-like shape in a horizontal face the same as that of the center of the bottomed cylinder type piezoelectric vibrator and is connected to the terminal portion 12c by way of the bent portion 12d. An explanation will be given as follows of the fact that by constituting the sectional shape of the external electrode terminal 12 by the channel-like shape, a length in the longitudinal direction of the surface mount type piezoelectric vibrator can be shortened.

FIG. 15B has been explained in the above-described embodiment and the section in the longitudinal direction of the external electrode terminal is constituted by the crank-shape. Although in FIG. 15A and FIG. 15B, the included bottomed cylinder type piezoelectric vibrator is constituted by the same dimension, the dimension in the longitudinal direction differs by a difference in the shape of the external electrode terminal. When a longitudinal direction dimension L1 of the terminal portion 12c of the vibrator shown in FIG. 15A and FIG. 15B is made to be common, a difference L in a dimension in the longitudinal direction is constituted by a dimension L2 shown in FIG. 15B. In this way, by constituting the sectional shape in the longitudinal direction of the external electrode terminal by the channel-like shape, the dimension in the longitudinal direction can be shortened, which can contribute to small-sized formation.

FIG. 15C is a perspective view of a portion of the external electrode terminal constituted by the channel-like shape. The bent portion 12d extended from the terminal portion 12c of the external electrode terminal to the side of the stem of the airtight terminal rises substantially vertically at a vicinity of the stem of the airtight terminal and formed by a width wider than the terminal portion, thereafter, folded back by about 90° in a direction opposed to the side of the stem and is formed with the connecting portion 12a and the external electrode terminal portion is constituted by a shape of a channel as a whole. At this occasion, the terminal portion 12c and the connecting portion 12a are not opposed to each other directly but arranged to constitute a skewed positional relationship.

FIG. 15D, FIG. 15E are views showing AA' section of FIG. 15A.

As shown by FIG. 15D, the lead 2c is arranged in parallel with an upper face of the connecting portion 12a. The lead 2c is arranged at the connecting portion 12a in a plane the same as that of the center of the piezoelectric vibrator of the bottomed cylinder type. Therefore, when the bottomed cylinder type piezoelectric vibrator is arranged at the lead frame 11 formed with the external electrode terminal 12, it is not necessary to bend the lead 2c in a vertical direction. Thereby, a step of bending can be omitted, further, occurrence of crack having a possibility of being produced by bending the lead at the filling member 4 at inside of the stem 3 can be prevented.

FIG. 15E is a view showing an outline of a positional relationship of electrodes for welding in connecting the lead 2c and the connecting portion 12a. After mechanically interposing the lead 2c and the connecting portion 12a between an upper electrode 21 and a lower electrode 22 sufficiently firmly, welding is carried out by applying a current. A shape of the external electrode terminal 12 is constituted such that operation of the lower electrode 22 in an up and down direction can be carried out by utilizing a space of a gap between the pair of terminal portions 12c arranged in parallel.

Although according to the above-described explanation, an explanation has been given of an example of one piece of the external electrode terminal, it is easy to pertinently change the embodiment to be applied to Embodiment 1, Embodiment 2, Embodiment 4, and Embodiment 5 mentioned above. Further, although it is apparent, when the second external electrode terminal shown by FIG. 11D and FIG. 11E of Embodiment 5 is provided on the side of the bottom face of the case to be opposed to the first external electrode terminal, also the sectional shape in the longitudinal direction of the second external electrode terminal can be constituted by the channel-like shape. The change is easy and therefore, an explanation thereof will be omitted.

Embodiment 7

Figure 16:
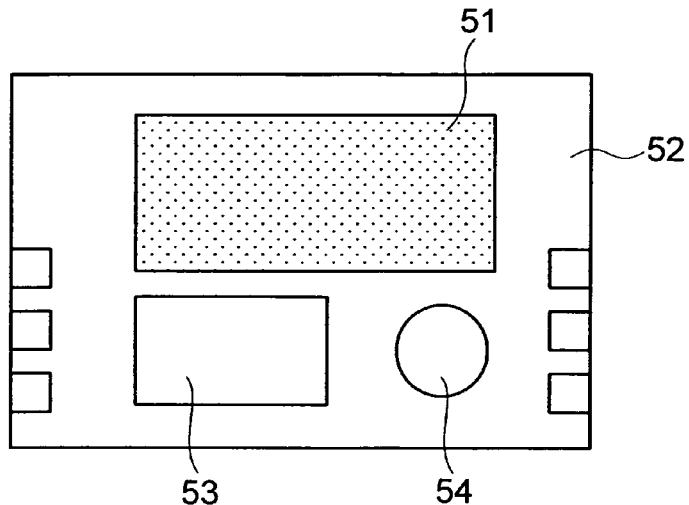
FIG. 16 is an outline constitution view showing a constitution of an oscillator according to a seventh embodiment.

As a seventh embodiment of the present invention, an oscillator in which the above-mentioned piezoelectric vibrator is connected to an integrated circuit as an oscillator is explained in conjunction with FIG. 16.

FIG. 16 is a rough schematic view showing the constitution of a tuning-fork-type quartz crystal oscillator and is a plan view showing a surface-mounting-type piezoelectric vibrator which makes use of the above-mentioned tuning-fork-type quartz crystal vibrator according to the present invention.

In FIG. 16, the tuning-fork-type quartz crystal vibrator 51 is set at a given position on a board 52, while an integrated circuit for oscillator indicated by numeral 53 is arranged close to the quartz crystal vibrator. Further, an electronic component 54 such as a capacitor is also mounted on the board 52. These respective parts are electrically connected with each other through a wiring pattern not shown in the drawing. The mechanical vibrations of a piezoelectric vibrator piece of the tuning-fork-type quartz crystal vibrator 51 are converted into electric signals due to the piezoelectric characteristic which the quartz crystal possesses and the electric signals are inputted to the integrated circuit 53. In the inside of the integrated circuit 53, the signal processing is performed and frequency signals are outputted and hence, the integrated circuit 53 functions as an oscillator. These respective constitutional parts are molded by resin not shown in the drawing. By selecting, for example, a RTC (Real Time Clock) module or the like as the integrated circuit 53, the integrated circuit 53 also has, besides a function of a single function oscillator for clock, a function of controlling an operation day and time of the oscillator and an external apparatus and a function of providing information on time and calendar to a user.

Using the piezoelectric vibrator manufactured by the manufacturing method of the present invention makes it possible to further reduce the size of a vibrator having a largest volume of the oscillator and therefore the oscillator can further be downsized as a whole.

Embodiment 8

Figure 17:
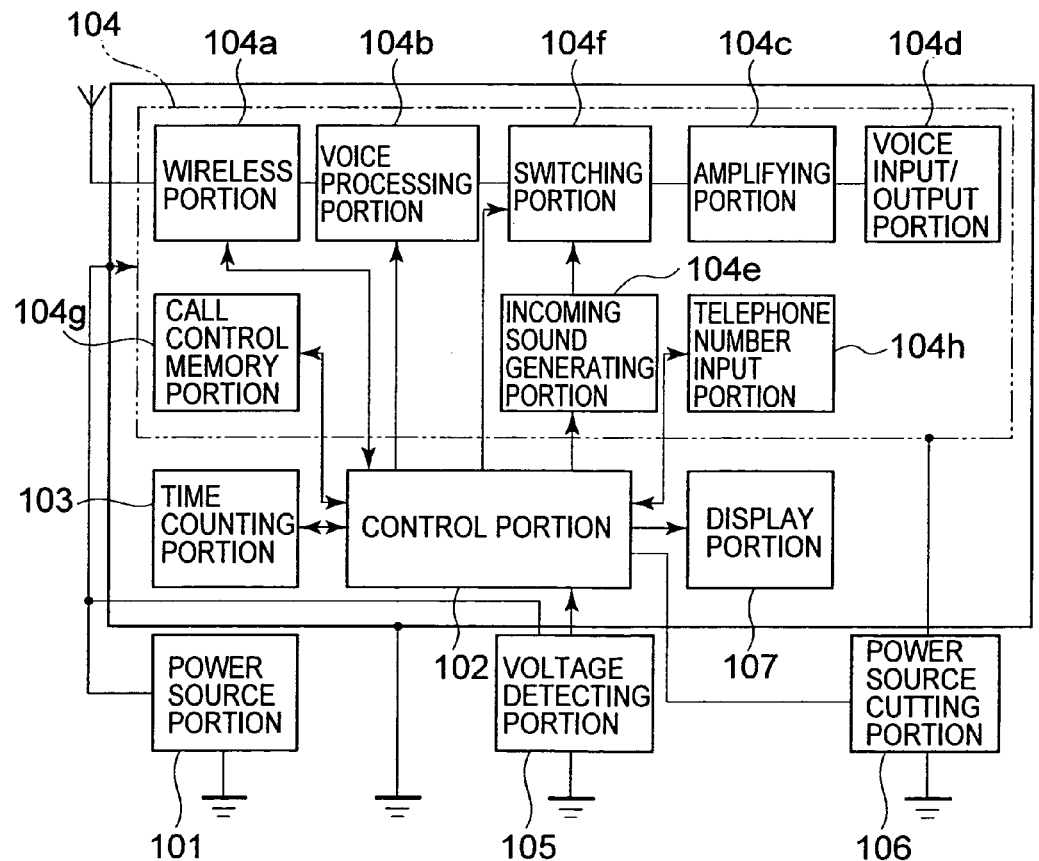
FIG. 17 is a block diagram functionally showing an example of a constitution of an electronic apparatus according to an eighth embodiment.

As an eighth embodiment of the present invention, an electronic apparatus used in a state that the above-mentioned piezoelectric vibrator is connected to a clock part is explained in conjunction with FIG. 17. As an example of the electronic apparatus, a preferred embodiment on a portable information apparatus represented by a mobile phone is explained in detail.

First of all, as a premise, the portable information apparatus according to this embodiment is a development or an improvement of a wrist watch of the related art. The portable information apparatus resembles the wrist watch in appearance, arranges a liquid crystal display on a portion thereof which corresponds to a dial plate, and can display a current time and the like on a screen of the display. In using the portable information apparatus as a communication device, the portable information apparatus is removed from a wrist and a user can perform the communication in the same manner as a mobile phone of the related art using a speaker or a microphone incorporated in the inside of a band portion. However, the portable information apparatus is drastically miniaturized and is light-weighted compared to the conventional mobile phone.

Next, the functional constitution of the portable information apparatus according to this embodiment is explained in conjunction with the drawing. FIG. 17 is a block diagram showing the constitution of the portable information apparatus 46 according to this embodiment functionally.

In FIG. 17, numeral 101 indicates a power source portion which supplies electricity to respective functional parts described later. To be more specific, the power source portion 101 is embodied by a lithium ion secondary cell. To the power source portion 101, a control portion 102, a time counting portion 103, a communication portion 104, a voltage detecting portion 105 and a display portion 107 are connected in parallel to each other, wherein the electricity is supplied to the respective functional parts from the power source portion 101.

The control portion 102 controls the respective functional parts described later and performs an operational control of the whole system such as the transmission and reception of vocal data, the measurement and display of the current time and the like. The control portion 102, to be more specific, is embodied by programs which are preliminarily written in a ROM, a CPU which reads out and executes the programs, a RAM which is used as a work area of the CPU and the like.

A time counting portion 103 is constituted of an integrated circuit which incorporates an oscillation circuit, a register circuit, a counter circuit, an interface circuit and the like therein and the tuning-fork-type quartz crystal vibrator which is above-described. The mechanical vibrations of the tuning-fork-type quartz crystal vibrator are converted into electric signals due to the piezoelectric characteristic which the quartz crystal possesses and the electric signals are inputted to the oscillation circuit which is constituted of a transistor and a capacitor. An output of the oscillation circuit is binarized and the binarized value is counted by the register circuit and the counter circuit. The transmission and reception of signals are performed between the time counting portion 103 and the control portion 102 through the interface circuit and the current time, the current date or the calendar information is displayed on the display portion 107.

The communication portion 104 functions in the same manner as the mobile phone of the related art and is constituted of a wireless portion 104a, a voice processing portion 104b, an amplifying portion 104c, a voice input/output portion 104d, an incoming sound generating portion 104e, a switching portion 104f, a call control memory portion 104g and a telephone number input portion 104h.

The wireless portion 104a transmits and receives various kinds of data such as vocal data with a base station via an antenna. The voice processing portion 104b codes and decodes the vocal signal inputted from the wireless portion 104a or the amplifying portion 104c described later. The amplifying portion 104c amplifies the signal inputted from the voice processing portion 104b or the voice input/output portion 104d described later to a given level. The voice input/output portion 104d is, to be more specific, a speaker or a microphone and amplifies an incoming call sound or a phone sound or collects a speaker's voice.

The incoming sound generating portion 104e generates an incoming call sound in response to calling from the base station. The switching portion 104f changes over the connection between the amplifying portion 104c and the voice processing portion 104b to the connection between the amplifying portion 104c and the incoming sound generating portion 104e only at the time of receiving the incoming signal and hence, the generated incoming call sound is outputted to the voice input/output portion 104d through the amplifying portion 104c.

Here, the call control memory portion 104g stores a program related to the outgoing/incoming calling control of the communication. Further, the telephone number input portion 104h, to be more specific, is constituted of number keys from 0 to 9 and some other keys and is served for inputting the telephone number of a telephone call destination or the like.

The voltage detecting portion 105, when a voltage applied to the respective functional parts including the control portion 102 from the power source portion 101 becomes lower than a given value, detects the lowering of the voltage and notifies the lowering of the voltage to the control portion 102. The given voltage value is a value which is preliminarily set as a minimum voltage for operating the communication portion 104 in a stable manner and is a voltage of approximately 3V, for example. The control portion 102, upon receiving the notification of lowering of the voltage from the voltage detecting portion 105, inhibits the operations of the wireless portion 104a, the voice processing portion 104b, the switching portion 104f and the incoming sound generating portion 104e. Particularly, the stopping of the operation of the wireless portion 104a which exhibits the large power consumption is indispensable. Simultaneously with such stopping of the operations, a message that the communication portion 104 is inoperable due to the shortage of the remaining battery amount is displayed on the display portion 107.

Due to the cooperative operation of the voltage detecting portion 105 and the control portion 102, it is possible to inhibit the operation of the communication portion 104 and it is also possible to display the inhibition of the operation of the communication portion 104 on the display portion 107.

In this embodiment, by providing a power source cutting portion 106 which can selectively interrupt the power supply of a portion corresponding to the function of the communication portion, it is possible to stop the function of the communication portion in a more complete form.

Here, although the display of the message that the communication portion 104 becomes inoperable may be performed using a letter message, the display may be performed by more instinctive methods including a method in which a mark "x" (meaning inoperable) is applied to a telephone icon on the display portion 107.

Using the miniaturized piezoelectric vibrator manufactured by the manufacturing method of the present invention in the portable information apparatus makes it possible to further reduce the size of the portable information apparatus as a whole maintaining the stable accuracy over a long period of time

Embodiment 9

Figure 18:
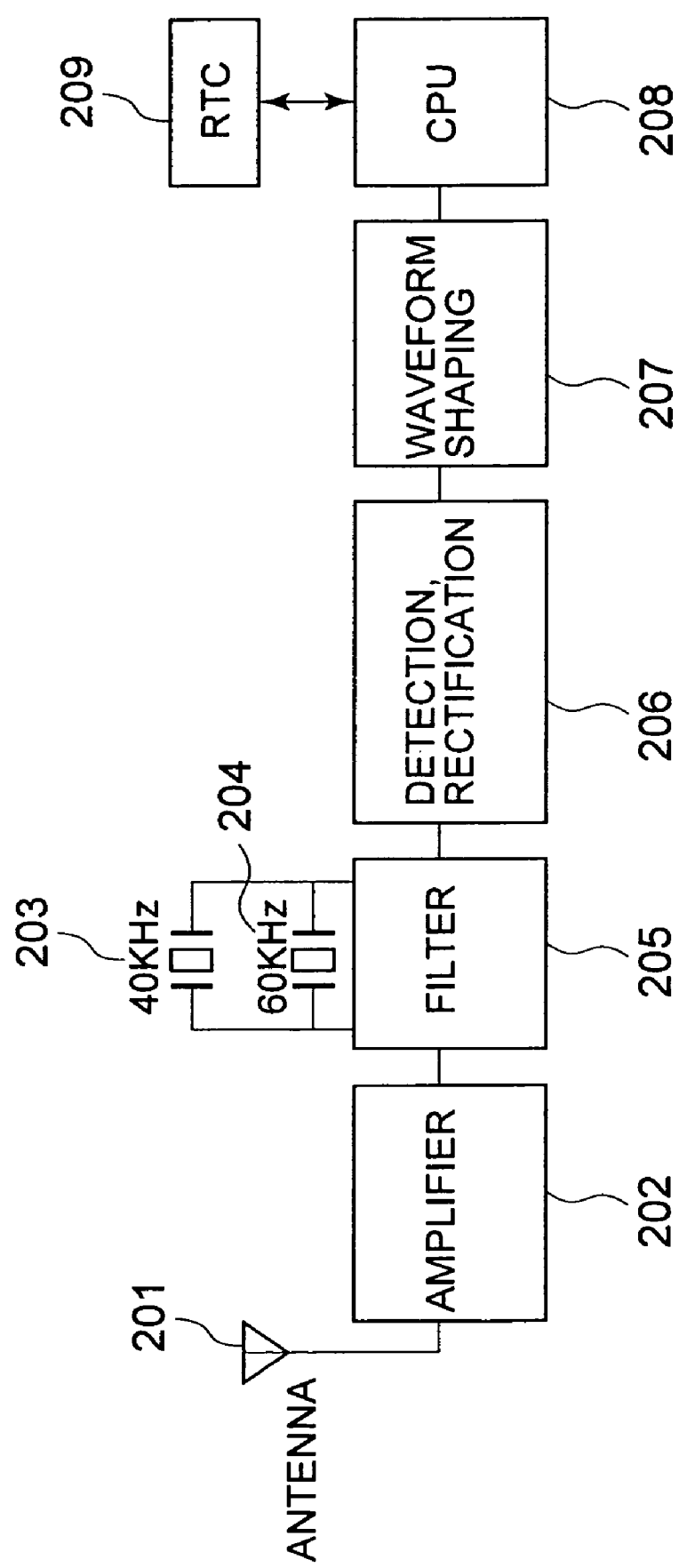
FIG. 18 is an outline view showing a circuit block of a radio wave timepiece according to a ninth embodiment.
Figure 19A:
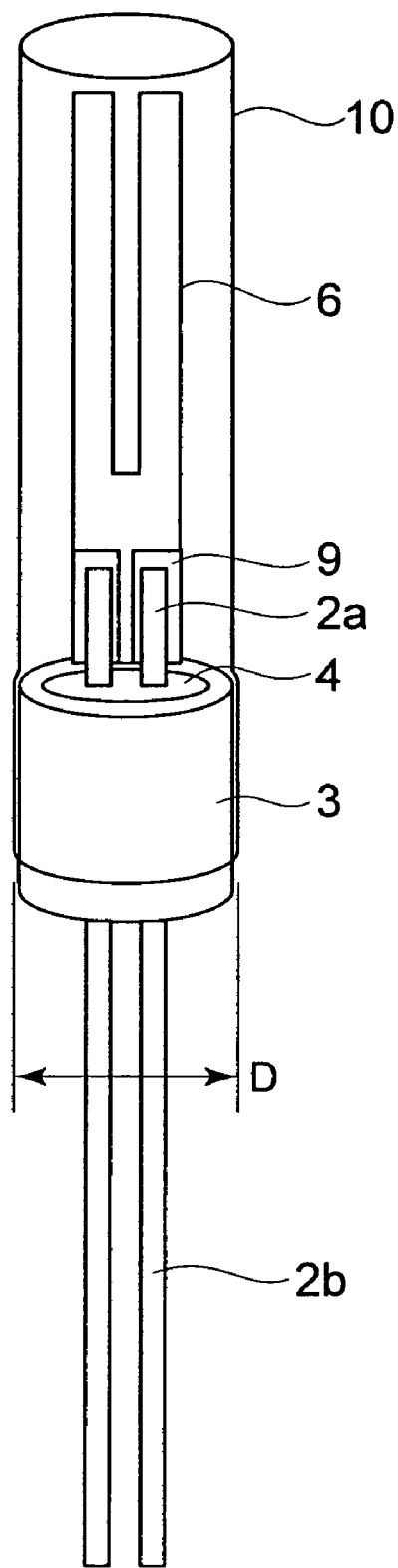
FIGS. 19A and 19B illustrate outline constitution views of a bottomed cylinder type piezoelectric vibrator of a related art.
Figure 19B:
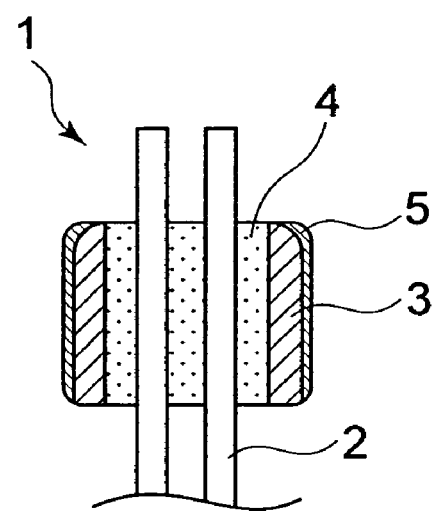
Figure 20A:
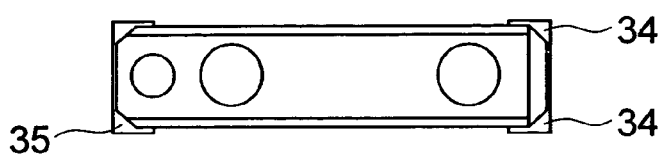
FIGS. 20A to 20G illustrate views showing a molded part and bonding to a lead frame of a related art.
Figure 20B:
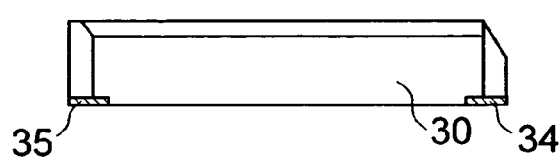
Figure 20E:
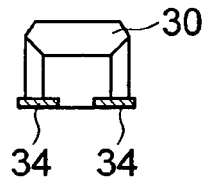
Figure 20C:
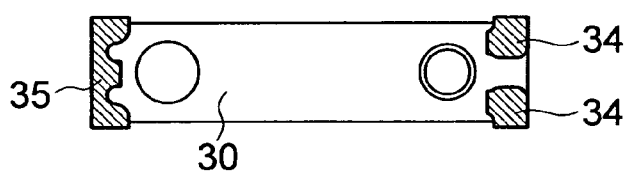
Figure 20D:
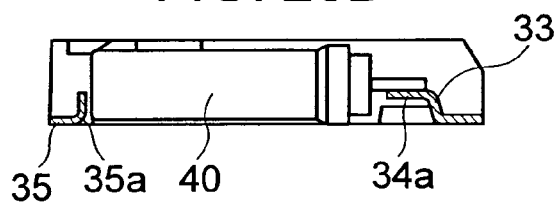
Figure 20F:
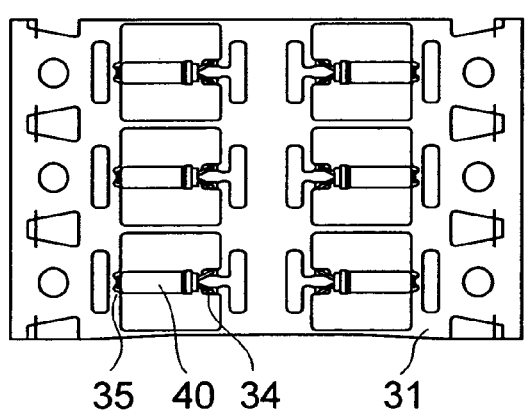
Figure 20G:
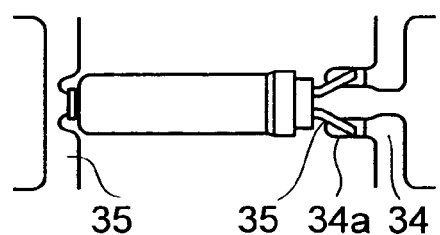

FIG. 18 is a schematic view showing a circuit block of a radio wave timepiece which constitutes an electronic apparatus according to the ninth embodiment of the present invention. The embodiment shows a case in which the tuning-fork-type quartz crystal vibrator (piezoelectric vibrator) manufactured by the manufacturing method of the present invention is connected to a filter part of the radio wave timepiece.

The radio wave timepiece is a clock which has a function of receiving the standard electric wave containing time information and displaying the time information by automatically correcting the time to an accurate time. In Japan, transmission stations (transmitting facilities) which transmit the standard electric waves are located in Fukushima prefecture (40 KHz) and Saga prefecture (60 KHz) and these transmission stations transmit the standard electric waves respectively. Long waves having frequency of 40 KHz or 60 KHz have a property that the long waves are propagated on a surface of the earth and a property that the long waves are propagated while being reflected between an ionosphere and the surface of the earth and hence, the propagation range is broad whereby the long waves cover the whole Japan with the above-mentioned two transmission stations.

In FIG. 18, an antenna 201 receives the standard electric waves formed of the long waves of 40 KHz or 60 KHz. The standard electric waves formed of long waves are electric waves obtained by applying the time information referred to as a time code to the carrier wave of 40 KHz or 60 KHz using the AM modulation.

The received standard electric waves formed of long waves are amplified by an amplifier 202. Subsequently, the standard electric waves are filtered by a filter part 205 containing quartz crystal vibrators 203, 204 having the same resonance frequency as the carrier wave frequency and are synchronized with the carrier wave. The filtered signal of given frequency is detected and demodulated by a detecting and rectifying circuit 206. Then, the time code is taken out through a waveform shaping circuit 207 and is counted by a CPU 208. The CPU 208 reads out the information such as the current year, the accumulated days, date, time and the like. The read-out information is reflected on a RTC 209 and the accurate time information is displayed.

Since the carrier wave is 40 KHz or 60 KHz, it is preferable to use the above-mentioned vibrator having the tuning-fork-type structure as the quartz crystal vibrators 203, 204 which constitute the filter parts respectively. Taking the long waves of 60 KHz, for example, as a size example of the tuning-fork-type vibrator piece, it is possible to configure the vibrator such that the vibrator has a total length of approximately 2.8 mm and a width size of a base portion thereof is approximately 0.5 mm.

The piezoelectric vibrator which is manufactured by the manufacturing method of the present invention is configured to be connected with the filter part of the radio wave timepiece and hence, the radio wave timepiece is enabled to further downsize as a whole maintaining the highly accurate filter function of the radio wave timepiece for a long period.

What is claimed is:

1. A surface mount type piezoelectric vibrator comprising:
    an airtight terminal including a stem in a ring-like shape comprising an electrically conductive material, a lead arranged to penetrate inside of the stem and electrically insulted from the stem, and a filling member for sealing the lead at inside of the stem hermetically;
    a piezoelectric vibrating piece having a pair of exciting electrodes, a first electrode of the pair of exciting electrodes being electrically connected to the lead, and a second electrode thereof is being electrically connected to the stem;
    a case of a bottomed cylinder type fixed to the stem to cover the piezoelectric vibrating piece to form an airtight space;

a first external electrode terminal, the first electrode and the first external electrode being electrically conductive through the lead;

a second external electrode terminal, the second electrode and the second external electrode being electrically conductive; and a mold resin which was molded on surfaces of the case and the airtight terminal to expose end portions of the respective first and second external electrode terminals.

2. The surface mount type piezoelectric vibrator according claim 1, wherein the first external electrode terminal is constituted by a sectional shape in a channel-like shape with regard to a longitudinal direction of the surface mount type piezoelectric vibrator.

3. The surface mount type piezoelectric vibrator according to claim 1, wherein the lead is made to constitute a first lead, further comprising:

a second lead arranged at inside of the stem for making the second electrode and the second external electrode terminal electrically conductive to each other; and a third external electrode terminal electrically insulated from the respective first and second electrodes and fixedly attached by the mold resin;

wherein end portions of the respective first, second, and third external electrode terminals are exposed.

4. The surface mount type piezoelectric vibrator according to claim 3, wherein an end portion on a side of an outer lead of the second lead is disposed at a position substantially the same as a position of an end portion on the side of the outer lead of the stem or slightly protruded therefrom;

wherein the case comprises an electrically conductive material; and wherein the second external electrode terminal is bonded to the stem or the case.

5. The surface mount type piezoelectric vibrator according to claim 1, wherein the lead is made to constitute the first lead, further comprising:

a second lead arranged at inside of the stem for making the second electrode and the second external electrode terminal electrically conductive to each other;

wherein an end portion on a side of an outer lead of the second lead is disposed at a position substantially the same as a position of an end portion on the side of the outer lead of the stem or slightly protruded therefrom;

wherein the case comprises an electrically conductive material; and wherein the second external electrode terminal is bonded to the case.

6. The surface mount type piezoelectric vibrator according to claim 5, further comprising:

a connecting member comprising an electrically conductive material at a bottom face of the case;

wherein the second external electrode terminal is bonded to the connecting member.

7. The surface mount type piezoelectric vibrator according to claim 1, wherein the stem includes a first and a second projected portion constituted by extending a portion of an outer periphery thereof in directions opposed to each other in an axial direction;

wherein the second electrode and the second external electrode terminal are made to be electrically conductive by way of the first and the second projected portions, further comprising:

a third external electrode terminal electrically insulated from the respective first and second electrodes and fixedly attached by the mold resin;

wherein end portions of the respective first, second and third external electrode terminals are exposed.

8. The surface mount type piezoelectric vibrator according to claim 1, wherein the stem includes a projected portion constituted by extending a portion of an outer periphery thereof in an axial direction;

wherein the case comprises an electrically conductive material;

wherein the second external electrode terminal is bonded to the stem or the case;

wherein the second electrode and the second external electrode terminal are made to be electrically conductive by way of the projected portion, further comprising:

a third external electrode terminal electrically insulated from the respective first and second electrodes and fixedly attached by the mold resin;

wherein end portions of the respective first, second and third external electrode terminals are exposed.

9. The surface mount type piezoelectric vibrator according to claim 1, wherein the stem includes a projected portion constituted by extending a portion of an outer periphery thereof in an axial direction;

wherein the case comprises an electrically conductive material;

wherein the second external electrode terminal is bonded to the case;

wherein the second electrode and the second external electrode terminal are made to be electrically conductive by way of the projected portion; and wherein end portions of the respective first, second external electrode terminals are exposed.

10. The surface mount type piezoelectric vibrator according to claim 9, further comprising:

a connecting member comprising an electrically conducive material at a bottom face of the case; and wherein the second external electrode terminal is bonded to the connecting member.

11. A method of fabricating a surface mount type piezoelectric vibrator for fabricating the surface mount type piezoelectric vibrator according to claim 1, the method comprising:

a first bonding step of bonding the first electrode of the piezoelectric electric vibrating piece to the lead of the airtight terminal, and bonding the second electrode to a portion of the airtight terminal electrically conductive to the stem, respectively;

a sealing step of inserting to fix the stem of the airtight terminal to the case to cover a surrounding of the piezoelectric vibrating piece bonded to the airtight terminal to thereby constitute the piezoelectric vibrator;

an external electrode terminal forming step of forming the first external electrode terminal and the second electrode terminal at a lead frame comprising an electrically conductive material;

a mounting step of arranging the piezoelectric vibrator at a predetermined position on the lead frame;

a second bonding step of bonding a side of an outer lead of the lead and the first external electrode terminal;

a third bonding step of bonding a surface of the piezoelectric vibrator electrically conductive to the stem and the second electrode terminal; and a molding step of molding the resin on surfaces of the case and the airtight terminal to expose end portions of the respective first and the second external electrode terminals.

12. The method of fabricating a surface mount type piezoelectric vibrator according to claim 11, wherein the lead of the airtight terminal bonded to the first electrode of the piezoelectric vibrating piece in the first bonding step is made to constitute a first lead, and the portion bonded to the second electrode electrically conductive to the stem is made to constitute a second lead;

wherein in the external electrode terminal forming step, the lead frame is further formed with a third external electrode terminal; and wherein in the molding step, the resin is molded to expose also an end portion of the third external electrode terminal in a state of making the third external electrode terminal and a surface of the piezoelectric vibrator electrically insulated from each other.

13. The method of fabricating a surface mount type piezoelectric vibrator according to claim 12, wherein as the airtight terminal, an airtight terminal in which an end portion on a side of an outer lead of the second lead is disposed at a position substantially the same as a position of an end portion on the side of the outer lead of the stem or slightly projected from is used.

14. The method of fabricating a surface mount type piezoelectric vibrator according to claim 11, wherein the lead of the airtight terminal bonded to the first electrode of the piezoelectric vibrating piece in the first bonding step is made to constitute the first lead, and a portion bonded to the second electrode electrically conductive to the stem is made to constitute a second lead;

wherein the airtight terminal in which an end portion on a side of an outer lead of the second lead is disposed at a position substantially the same as a portion of an end portion on a side of an outer lead of the stem or slightly projected therefrom is used; and wherein in the third bonding step, a surface of the piezoelectric vibrator is bonded to the second external electrode terminal as a surface of the case.

15. The method of fabricating a surface mount type piezoelectric vibrator according to claim 14, further comprising:

a connecting member bonding step of bonding a connecting member comprising an electrically conductive material to a bottom surface of the case before the sealing step;

wherein in the third bonding step, a surface of the piezoelectric vibrator is bonded to the second external electrode terminal as a surface of the bonding member.

16. The method of fabricating a surface mount type piezoelectric vibrator according to claim 11, wherein an airtight terminal including a first and a second projected portion constituted by extending a portion of an outer periphery of the stem of the airtight terminal in directions opposed to each other in an axial direction is used;

wherein in the first bonding step, the first electrode of the piezoelectric vibrating piece is bonded to the lead, and the second electrode is bonded to the first protruded portion, respectively;

wherein in the third bonding step, the second protruded portion and the second external electrode terminal are bonded;

wherein in the external electrode terminal forming step, the lead frame is further formed with a third external electrode terminal; and wherein the resin is molded to expose also an end portion of the third external electrode terminal in a state of electrically insulating the third external electrode terminal and a surface of the piezoelectric vibrator from each other.

17. The method of fabricating a surface mount type piezoelectric vibrator according to claim 11, wherein the airtight terminal including a protruded portion constituted by extending a portion of an outer periphery of the stem of the airtight terminal in an axial direction is used;

wherein in the first bonding step, the first electrode of the piezoelectric vibrating piece is bonded to the lead, and the second electrode is bonded to the protruded portion respectively;

wherein in the external electrode terminal forming step, the lead frame is further formed with a third external electrode terminal; and wherein in the molding step, the resin is molded to expose also an end portion of the third external electrode terminal in a state of electrically insulating the third external electrode terminal and the surface of the piezoelectric vibrator from each other.

18. The method of fabricating a surface mount type piezoelectric vibrator according to claim 11, wherein the airtight terminal including a projected portion constituted by extending a portion of an outer periphery of the stem of the airtight terminal in an axial direction is used; and wherein in the first bonding step, the first electrode of the piezoelectric vibrating piece is bonded to the lead and the second electrode is bonded to the protruded portion, respectively.

19. The method of fabricating a surface mount type piezoelectric vibrator according to claim 18, further comprising:

a connecting member bonding step of bonding a connecting member comprising an electrically conductive material to a bottom surface of the case before the sealing step;

wherein in the third bonding step, a surface of the piezoelectric vibrator is bonded to the second external electrode terminal as a surface of the connecting member.

20. An oscillator, wherein a surface mount type piezoelectric vibrator according to claim 1 is used as an oscillating piece by being connected to an integrated circuit.

21. An electronic apparatus, wherein the surface mount type piezoelectric vibrating piece according to claim 1 is used by being connected to a time counting portion.

22. A radio wave timepiece, wherein the surface mount type piezoelectric vibrator according to claim 1 is used by being connected to a filter portion.

* * * * *

UNITED STATES PATENT AND TRADEMARK OFFICE
CERTIFICATE OF CORRECTION

| | | |
|---|---|---|
| PATENT NO. | : 7,397,171 B2 | Page 1 of 1 |
| APPLICATION NO. | : 11/505594 | |
| DATED | : July 8, 2008 | |
| INVENTOR(S) | : Hiroaki Uetake et al. | |

It is certified that error appears in the above-identified patent and that said Letters Patent is hereby corrected as shown below:

<u>On the Title Page</u>

Item (75), delete "Chiba" and substitute --Chiba-shi-- in its place (both occurrences).

In column 27, claim 2, line 10, after "piezoelectric vibrator according" insert --to--.

Signed and Sealed this

Twenty-eighth Day of April, 2009

JOHN DOLL
*Acting Director of the United States Patent and Trademark Office*